US009281488B2

(12) United States Patent
Lee et al.

(10) Patent No.: US 9,281,488 B2
(45) Date of Patent: Mar. 8, 2016

(54) SIMPLIFIED ORGANIC EMITTING DIODE AND METHOD FOR PREPARING THE SAME

(71) Applicant: POSTECH ACADEMY-INDUSTRY FOUNDATION, Pohang-si, Gyeongsangbuk-do (KR)

(72) Inventors: Tae Woo Lee, Pohang-si (KR); Tae Hee Han, Incheon (KR)

(73) Assignee: POSTECH ACADEMY-INDUSTRY FOUNDATION, Pohang-Si, Gyeongsangbuk-Do (KR)

( * ) Notice: Subject to any disclaimer, the term of this patent is extended or adjusted under 35 U.S.C. 154(b) by 60 days.

(21) Appl. No.: 14/349,659

(22) PCT Filed: Oct. 12, 2012

(86) PCT No.: PCT/KR2012/008290
§ 371 (c)(1),
(2) Date: Apr. 4, 2014

(87) PCT Pub. No.: WO2013/055138
PCT Pub. Date: Apr. 18, 2013

(65) Prior Publication Data
US 2014/0239287 A1 Aug. 28, 2014

(30) Foreign Application Priority Data
Oct. 12, 2011 (KR) ........................ 10-2011-0104087

(51) Int. Cl.
*H01L 51/52* (2006.01)
*H01L 51/56* (2006.01)
(Continued)

(52) U.S. Cl.
CPC ........ *H01L 51/5004* (2013.01); *H01L 51/0026* (2013.01); *H01L 51/0037* (2013.01);
(Continued)

(58) Field of Classification Search
CPC .................................................. H01L 2251/55
See application file for complete search history.

(56) References Cited

U.S. PATENT DOCUMENTS

| 7,728,098 | B2 | 6/2010 | Dams et al. | |
|---|---|---|---|---|
| 2007/0069636 | A1* | 3/2007 | Choulis et al. | 313/504 |

(Continued)

FOREIGN PATENT DOCUMENTS

| JP | 2007-221132 A | 8/2007 |
|---|---|---|
| JP | 2009-510796 A | 3/2009 |

(Continued)

OTHER PUBLICATIONS

International Preliminary Report on Patentability for PCT/KR2012/008290 mailed Apr. 24, 2014.

(Continued)

*Primary Examiner* — Stephen W Smoot
(74) *Attorney, Agent, or Firm* — Nixon Peabody LLP; Joseph Bach, Esq.

(57) ABSTRACT

An organic light emitting device having a simplified structure, and a method of fabricating the same, are provided. The organic light emitting device comprises an anode, a conductive polymer layer having a surface 1A in contact with the anode and a surface 2A opposite to the surface 1A, a low molecular light emitting layer having a surface 1B in contact with the surface 2A and a surface 2B opposite to the surface 1B, and a cathode in contact with the surface 2B. The conductive polymer layer is a single layer including a conductive polymer having a conductivity of $1\times10^{-7}$ S/cm to less than 0.1 S/cm, and a material having low surface energy, a concentration of the material having low surface energy of the surface 2A is greater than a concentration of the material having low surface energy of the surface 1A.

18 Claims, 5 Drawing Sheets

(51) Int. Cl.
*H01L 51/50* (2006.01)
*H01L 51/00* (2006.01)

(52) U.S. Cl.
CPC ........ *H01L51/5088* (2013.01); *H01L 51/5206* (2013.01); *H01L 51/5221* (2013.01); *H01L 51/56* (2013.01); *H01L 2251/55* (2013.01)

(56) References Cited

U.S. PATENT DOCUMENTS

| | | | |
|---|---|---|---|
| 2007/0075631 A1 | 4/2007 | Tung et al. | |
| 2007/0285010 A1* | 12/2007 | Lee et al. | 313/504 |
| 2008/0265756 A1* | 10/2008 | McKiernan et al. | 313/504 |
| 2010/0044682 A1* | 2/2010 | Bolink et al. | 257/40 |
| 2011/0240965 A1* | 10/2011 | Yoon et al. | 257/40 |

FOREIGN PATENT DOCUMENTS

| | | |
|---|---|---|
| KR | 10-1999-0054477 A | 7/1999 |
| KR | 10-1999-0055417 A | 7/1999 |
| KR | 10-2007-070650 A | 7/2007 |

OTHER PUBLICATIONS

International Search Report for PCT/KR2012/008290 mailed Mar. 21, 2013.
Lee et al., "Self-Organized Gradient Hole Injection to Improve the Performance of Polymer Electroluminescent Devices," Advanced Functional Materials, vol. 17, Issue 3, Jan. 18, 2007, pp. 390-396.
Lee et al., "Hole-injecting conducting-polymer compositions for highly efficient and stable organic light-emitting diodes," Applied Physics Letters, vol. 87, Issue 231106, Nov. 29, 2005, pp. 231106-1-231106-3.

* cited by examiner

SIMPLIFIED ORGANIC EMITTING DIODE AND METHOD FOR PREPARING THE SAME

RELATED APPLICATIONS

This application is a National Phase of International Application No. PCT/KR2012/008290, filed on Oct. 12, 2012, and which claims priority of Korean Patent Application No. 10-2011-0104087, filed on Oct. 12, 2011, and the disclosures of which are hereby incorporated by reference herein in their entirety.

TECHNICAL FIELD

The present invention relates to an organic light emitting device, and a method of fabricating the same.

BACKGROUND ART

Organic light emitting devices are self-luminous device, have a wide viewing angle, excellent contrast, fast response time, high brightness, and excellent driving voltage and response rate characteristics, and can realize a multicolor display.

Normal organic light emitting devices may include an anode, a cathode, and an organic layer interposed between the anode and the cathode. The organic layer may include an electron injection layer, a hole transport layer, a light emitting layer, an electron transport layer, cathode, etc. When a voltage is applied between the anode and the cathode, holes injected from the anode is transferred to the light emitting layer via the hole transport layer, and electrons injected from the cathode is transferred to the light emitting layer via the electron transport layer. Carriers, such as the electrons and the holes, recombine in the light emitting layer to generate excitons, which generate light while being changed from an excited state to a ground state.

In order to increase efficiency and life of the device, the organic light emitting devices have been developed in such a way to increase an auxiliary layer (or a buffer layer), such as a hole injection layer, a hole transport layer, and an electron transport layer. Accordingly, costs for materials and processes for manufacturing the device have gradually increased, and how to solve the problem has become a major issue in the organic light emitting device.

When the auxiliary layer of the organic light emitting device is formed in a thin film or removed, the distance between the light emitting layer and the electrode (for example, the anode or the cathode) may be reduced, resulting in occurrence of an exciton quenching phenomenon in the light emitting layer. That is, the auxiliary layer, such as the hole injection layer, the hole transport layer, and the electron transport layer, may function to prevent the exciton quenching phenomenon in the light emitting layer.

Accordingly, in order to manufacture a high quality organic light emitting device, it is important to minimize the exciton quenching phenomenon with simplifying the structure of device by removing the auxiliary layer, such as the hole injection layer, the hole transport layer, and the electron transport layer.

Technical Problem

The present invention is directed to provide an organic light emitting device which has high efficiency and a simplified structure, and achieves reduced manufacturing costs.

Technical Solution

In accordance with an aspect of the present invention, an organic light emitting device includes an anode, a conductive polymer layer having a surface 1A and a surface 2A opposite to the surface 1A, a low molecular light emitting layer having a surface 1B and a surface 2B opposite to the surface 1B, and a cathode which are sequentially stacked. A surface of the anode is in contact with the surface 1A of the conductive polymer layer, the surface 2A of the conductive polymer layer is in contact with the surface 1B of the low molecular light emitting layer, and the surface 2B of the low molecular light emitting layer is in contact with a surface of the cathode. The conductive polymer layer is a single layer including a conductive polymer having a conductivity of $1\times10^{-7}$ S/cm to less than 0.1 S/cm, and a material having low surface energy, a concentration of the material having low surface energy of the surface 2A is greater than a concentration of the material having low surface energy of the surface 1A, the absolute value of a low unoccupied molecular orbital (LUMO) energy level of the surface 2A is smaller than the absolute value of a LUMO energy level of the low molecular light emitting layer, and the surface 2A functions to prevent exciton quenching. The low molecular light emitting layer includes a low molecular light emitting material, and electron mobility of the low molecular light emitting material is the same as or greater than hole mobility of the low molecular light emitting material.

In some embodiments, the absolute value of a high occupied molecular orbital (HOMO) energy level (that is, an ionization potential) of the surface 1A may be greater than a work function of the anode.

In other embodiments, the absolute value of a HOMO energy level of the surface 2A may be greater than the absolute value of a HOMO energy level of the low molecular light emitting layer.

In still other embodiments, during operation of the organic light emitting device, an exciton-forming region may be formed at an interface between the conductive polymer layer and the low molecular light emitting layer.

In still other embodiments, the concentration of the material having low surface energy may gradually increase along a direction from the surface 1A toward the surface 2A.

In still other embodiments, the material having low surface energy may be a fluorinated material including at least one fluorine (F).

In still other embodiments, the conductive polymer may include one or more of polythiophene, polyaniline, polypyrrole, poly(para-phenylene), polyfluorene, poly(3,4-ethylenedioxythiophene), a self-doping conductive polymer, and a derivative thereof. The conductive polymer may further include a polymer acid such as sulfonated polystyrene.

In still other embodiments, an ionization potential of the surface 2A may be selected from the range of 5.0 eV to 6.5 eV.

In still other embodiments, the low molecular light emitting layer may include a host and dopant, and the host may include an electron transport low molecular material.

In still other embodiments, the cathode may include an electron injection layer and a metal-containing layer, and the electron injection layer may be in contact with the surface 2B of the low molecular light emitting layer.

In accordance with another aspect of the present invention, a method of fabricating the organic light emitting device includes forming an anode on a substrate, forming a conductive polymer layer by supplying a composition for forming the conductive polymer layer including a conductive polymer, a material having low surface energy, and a solvent onto the anode, and performing a heat treatment, forming a low molecular light emitting layer on the conductive polymer layer, and forming a cathode on the low molecular light emitting layer.

In some embodiments, the solvent included in the composition for forming the conductive polymer layer may be a polar solvent, and the polar solvent may be one or more of water, alcohol, ethylene glycol, glycerol, dimethylformamide (DMF), dimethyl sulfoxide (DMSO), and acetone.

In other embodiments, the forming of the low molecular light emitting layer may be performed using a vacuum deposition method and a solution method.

Advantageous Effects

According to embodiments of the present invention, since an organic light emitting device has a simplified structure while having high efficiency, manufacturing costs can be reduced.

MODES FOR CARRYING OUT THE INVENTION

Hereinafter, embodiments of the present invention will be fully described with reference to the accompanying drawings. The present invention may, however, be embodied in different forms and should not be construed as limited to the embodiments set forth herein. The present invention should be understood to include all the equivalents and substitutions included in the spirit and scope of the present invention.

Figure 1:
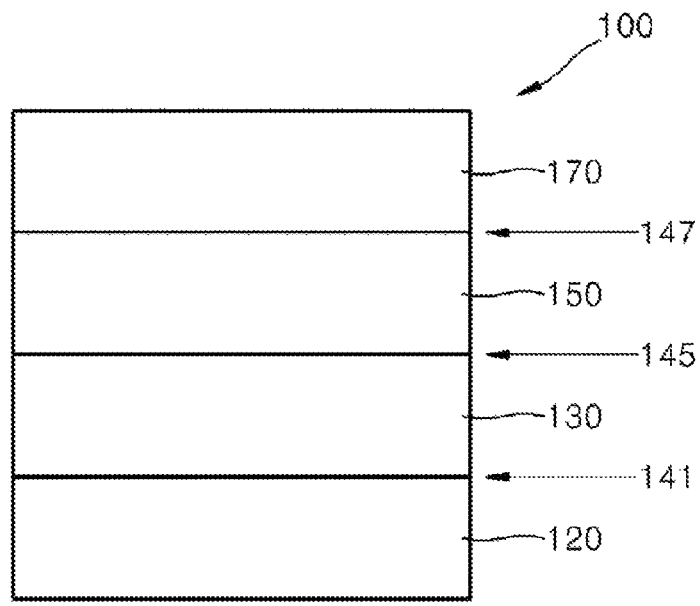
FIG. 1 is a diagram schematically describing a cross-section of an organic light emitting device in accordance with an embodiment of the present invention.

FIG. 1 is a diagram schematically showing an organic light emitting device 100 in accordance with an embodiment of the present invention. The organic light emitting device 100 sequentially includes an anode 120 which is a hole injection electrode, a conductive polymer layer 130, a low molecular light emitting layer 150, and a cathode 170 which is an electron injection electrode. When a voltage is applied between the anode 120 and the cathode 170 of the organic light emitting device 100, holes injected from the anode 120 moves to the low molecular light emitting layer 150 via the conductive polymer layer 130, and electrons injected from the cathode 170 moves to the low molecular light emitting layer 150, thereby the holes and electrons recombine between the conductive polymer layer 130 and the low molecular light emitting layer 150 to generate excitons. Light is generated while the excitons shift from an excited state to a ground state.

The conductive polymer layer 130 includes a surface 1A 141 and a surface 2A 145 opposite to the surface 1A 141, and the low molecular light emitting layer 150 includes a surface 1B 145 and a surface 2B 147 opposite to the surface 1B 145.

A surface of the anode 120 is in contact with the surface 1A 141 of the conductive polymer layer 130, the surface 2A 145 of the conductive polymer layer 130 is in contact with the surface 1B 145 of the low molecular light emitting layer 150, and the surface 2B 147 of the low molecular light emitting layer 150 is in contact with a surface of the cathode 170. Accordingly, the surface 2A and the surface 1B are indicated by the same reference numeral 145.

Although not shown in FIG. 1, the anode 120 may be formed on a substrate. As the substrate, a substrate which is conventionally used in a semiconductor manufacturing process may be used. For example, the substrate may include glass, sapphire, silicon, silicon oxide, a metal foil (e.g. a copper foil or an aluminum foil), a steel substrate (e.g. stainless steel, etc.), a metal oxide, a polymer substrate, or a combination of two or more thereof. As an example of the metal oxide, there are aluminum oxide, molybdenum oxide, indium oxide, tin oxide, indium tin oxide, vanadium oxide, etc. As an example of the polymer substrate, there are a kapton foil, polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), cellulose acetate propionate (CAP), etc., but the present invention is not limited thereto.

The anode 120 may be formed by supplying an anode-forming material on the substrate using a deposition method or a sputtering method. The anode 120 may be selected from materials having a relatively high work function so as to facilitate hole injection. The anode 120 may be a reflective electrode or a transparent electrode. As the anode-forming material, indium tin oxide (ITO), indium zinc oxide (IZO), tin oxide ($SnO_2$), zinc oxide (ZnO), a metal oxide/metal/metal oxide multilayer, graphene, carbon nanotube, etc. that are transparent and have excellent conductivity, may be used. Otherwise, the anode 120 may be formed as a reflective electrode using magnesium (Mg), aluminum (Al), silver (Ag), Ag/ITO, Ag/IZO, aluminum-lithium (Al—Li), calcium (Ca), magnesium-indium (Mg—In), magnesium-silver (Mg—Ag), etc. The anode 120 may include different kinds of two materials. For example, the anode 120 may be formed to have a two-layered structure including different kinds of two materials, and various modifications are possible.

The conductive polymer layer 130 may be a single layer including a conductive polymer having a conductivity of from $1 \times 10^{-7}$ S/cm to less than 0.1 S/cm and a material having low surface energy. The concentration of the material having low surface energy at the surface 2A 145 of the conductive polymer layer 130 may be greater than the concentration of the material having low surface energy at the surface 1A 141 of the conductive polymer layer 130. The absolute value of a high occupied molecular orbital (HOMO) energy level of the surface 2A 145, that is, an ionization potential, may be 5.0 eV or more, for example, 5.0 eV to 6.5 eV.

In the specification, "a material having low surface energy" refers to a material capable of forming a layer having low surface energy, and specifically, a material having a lower surface energy than the conductive polymer. Since a composition in which the material having low surface energy and the conductive polymer are mixed undergoes phase separation due to a surface energy difference between the material having low surface energy and the conductive polymer, the material having low surface energy forms an upper phase, and the conductive polymer forms a lower phase. The material having low surface energy is a material which contains at least one F, and has higher hydrophobicity than the conductive polymer. In addition, the material having low surface energy may be a material capable of providing a higher work function than the conductive polymer. For example, a thin film formed of the material having low surface energy may have a surface energy of 30 mN/m or less, and a conductivity of $10^{-1}$ S/cm to $10^{-1}$ S/cm in a thickness of 100 nm. Further, a thin film fabricated using a conductive polymer composition including the material having low surface energy may have a surface energy of 30 mN/m or less, and a conductivity of $1 \times 10^{-7}$ S/cm to less than 0.1 S/cm in a thickness of 100 nm.

Accordingly, when a layer containing a composition for forming a conductive polymer layer including the conductive polymer and the material having low surface energy is formed on the anode 120, the conductive polymer and the material having low surface energy may not be mixed homogeneously due to low surface energy of the material having low surface energy. Instead, the conductive polymer and the material having low surface energy may be distributed in such a way that the concentration of the material having low surface energy gradually increases along a direction from the surface 1A 141 toward the surface 2A 145 while the concentration of the conductive polymer gradually increases along a direction from the surface 2A 145 toward the surface 1A 141. Next, a film-forming process may be finished by baking the layer, which is formed on the anode 120, containing the composition for forming a conductive polymer layer including the conductive polymer and the material having low surface energy. Thereby, the conductive polymer layer 130 in which the concentration of the material having low surface energy gradually increases along the direction from the surface 1A 141 toward the surface 2A 145 may be formed.

Since the conductive polymer layer 130 is formed through self-organization of the conductive polymer and the material having low surface energy in just one solution film-forming process, the conductive polymer layer 130 has a form of a single layer in which the conductive polymer layer and a layer of the material having low surface energy are not distinguished from each other.

Figure 2:
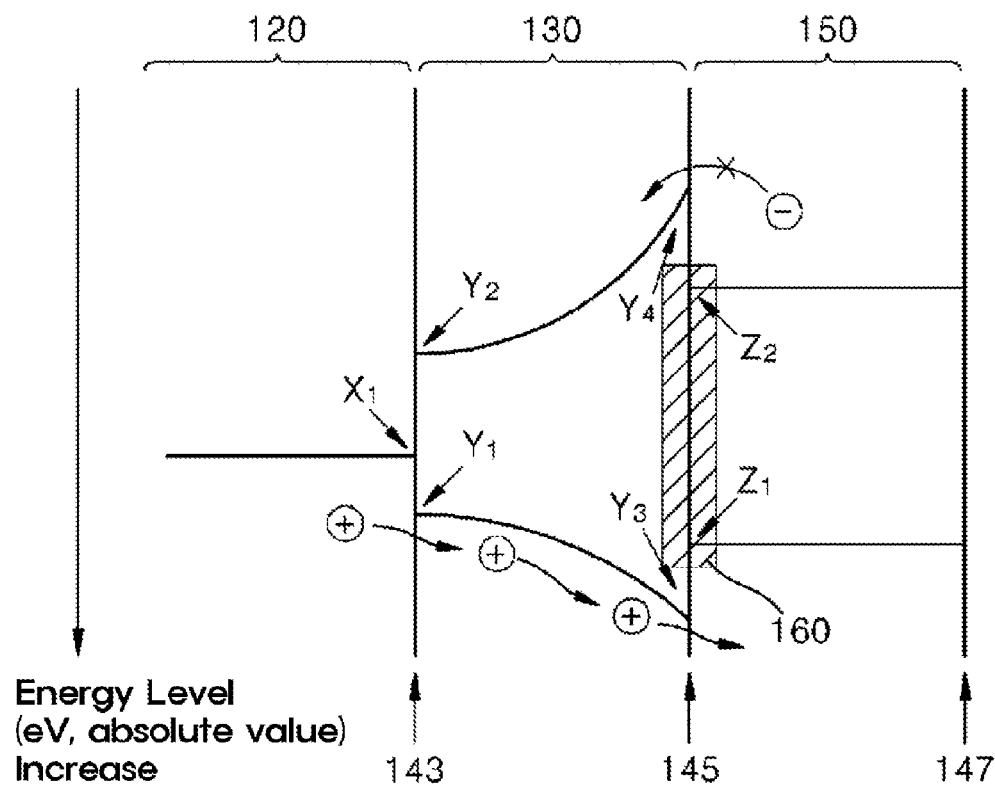
FIG. 2 is a diagram illustrating the absolute values of interlayer energy levels of an organic light emitting device.

FIG. 2 is a diagram schematically showing energy levels of the anode 120, the conductive polymer layer 130, and the low molecular light emitting layer 150 of the organic light emitting device 100.

HOMO and/or low unoccupied molecular orbital (LUMO) values of the conductive polymer layer 130 and the low molecular light emitting layer 150 are located below the vacuum level, and expressed by negative numbers. However, in order to be compared with a work function $X_1$ of the anode 120 expressed by a positive number, the HOMO and/or LUMO values of the conductive polymer layer 130 and the low molecular light emitting layer 150 are expressed by absolute numbers.

The concentration of the material having low surface energy gradually increases along the direction from the surface 1A 141 toward the surface 2A 145 of the conductive polymer layer 130. Accordingly, in the conductive polymer layer 130, the absolute value $Y_1$ of a HOMO energy level of the surface 1A 141 is smaller than the absolute value $Y_3$ of a HOMO energy level of the surface 2A 145, and the absolute value $Y_2$ of a LUMO energy level of the surface 1A 141 is greater than the absolute value $Y_4$ of a LUMO energy level of the surface 2A 145.

The absolute value $Y_4$ of the LUMO energy level of the surface 2A 145 of the conductive polymer layer 130 may be smaller than the absolute value $Z_2$ of a LUMO energy level of the low molecular light emitting layer 150. Accordingly, electrons injected from the cathode 170 and transferred to the low molecular light emitting layer 150 may not be substantially transferred to the conductive polymer layer 130. Accordingly, the conductive polymer layer 130 may function as an electron barrier layer (EBL).

Meanwhile, the absolute value $Y_1$ of the HOMO energy level of the surface 1A 141 of the conductive polymer layer 130 may be greater than the work function $X_1$ of the anode 120. In addition, the absolute value $Y_3$ of the HOMO energy level of the surface 2A 145 of the conductive polymer layer 130 may be greater than the absolute value $Z_1$ of a HOMO energy level of the low molecular light emitting layer 150. Accordingly, hole injection from the anode 120 to the conductive polymer layer 130, and hole transfer from the conductive polymer layer 130 to the low molecular light emitting layer 150 can be made smoothly.

As a result, an exciton forming region 160 in which electrons and holes recombine to form excitons may be formed between the conductive polymer layer 130 and the low molecular light emitting layer 150. Thereby, the organic light emitting device 100 may have excellent light emitting efficiency.

Since the material having low surface energy exists relatively more than the conductive polymer at the surface 2A 145 of the conductive polymer layer 130, the surface 2A 145 substantially prevents excitons generated from the exciton forming region 160 from being quenched due to the conductive polymer included in the conductive polymer layer 130. Accordingly, the organic light emitting device 100 may have excellent light emitting efficiency.

The material having low surface energy may be a material having a solubility of more than 90%, for example, a solubility of more than 95%, with respect to a polar solvent. The material having low surface energy may be dispersed in the polar solvent in the form of nanoparticles having an average diameter of 10 nm or less. As an example of the polar solvent, but not limited thereto, there are water, alcohol (methanol, ethanol, n-propanol, 2-propanol, n-butanol, etc.), ethylene glycol, glycerol, dimethylformamide (DMF), dimethyl sulfoxide (DMSO), acetone, etc.

The material having low surface energy may be a material having at least one F. For example, the material having low surface energy may be a fluorinated polymer or fluorinated oligomer including at least one fluorine (F).

In some embodiments, the material having low surface energy may be a fluorinated polymer having any one of repeating units represented by the following Chemical Formulas 1 to 3:

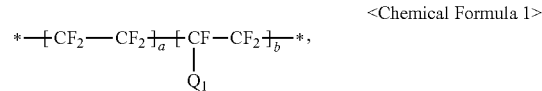

<Chemical Formula 1> wherein a is a number of from 0 to 10,000,000;
b is a number of from 1 to 10,000,000; and
$Q_1$ is —[O—C($R_1$)($R_2$)—C($R_3$)($R_4$)]$_c$—[OCF$_2$CF$_2$]$_d$—$R_5$, —COOH, or —O—$R_f$—$R_6$,
wherein $R_1$, $R_2$, $R_3$, and $R_4$ are independently —F, —CF$_3$, —CHF$_2$, or —CH$_2$F;
c and d are independently a number of from 0 to 20;
$R_f$ is —(CF$_2$)$_z$— (z is an integer of from 1 to 50) or —(CF$_2$CF$_2$O)$_z$—CF$_2$CF$_2$— (z is an integer of from 1 to 50); and
$R_5$ and $R_6$ are independently —SO$_3$M, —PO$_3$M$_2$, or —CO$_2$M,
wherein M is Na$^+$, K$^+$, Li$^+$, H$^+$, CH$_3$(CH$_2$)$_w$NH$_3^+$ (w is an integer of from 0 to 50), NH$_4^+$, NH$_2^+$, NHSO$_2$CF$_3^+$, CHO$^+$, C$_2$H$_5$OH$^+$, CH$_3$OH$^+$, or CH$_3$(CH$_2$)$_w$CHO$^+$ (w is an integer of from 0 to 50), <Chemical Formula 2>

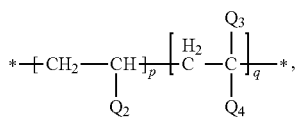

wherein $Q_2$ is hydrogen (H), a substituted or unsubstituted $C_5$-$C_{60}$ aryl group, or —COOH;

$Q_3$ is H or a substituted or unsubstituted $C_1$-$C_{20}$ alkyl group; and $Q_4$ is —O—$(CF_2)_r$—$SO_3M$, —O—$(CF_2)_r$—$PO_3M_2$, —O—$(CF_2)_r$—$CO_2M$, or —CO—NH—$(CH_2)_s$—$(CF_2)_t$—$CF_3$, wherein r, s, and t are independently a number of from 0 to 20; and M is $Na^+$, $K^+$, $Li^+$, $H^+$, $CH_3(CH_2)_w NH_3^+$ (w is an integer of from 0 to 50), $NH_4^+$, $NH_2^+$, $NHSO_2CF_3^+$, $CHO^+$, $C_2H_5OH^+$, $CH_3OH^+$, or $CH_3(CH_2)_w CHO^+$ (w is an integer of from 0 to 50), and <Chemical Formula 3>

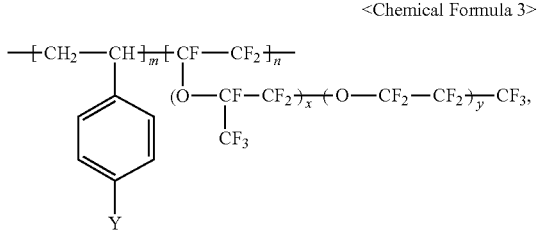

wherein m and n are $0 \leq m < 10,000,000$ and $0 < n \leq 10,000,000$;

x and y are independently a number of from 0 to 20; and

Y is —$SO_3M$, —$PO_3M_2$, or —$CO_2M$, wherein M is $Na^+$, $K^+$, $Li^+$, $H^+$, $CH_3(CH_2)_w NH_3^+$ (w is an integer of from 0 to 50), $NH_4^+$, $NH_2^+$, $NHSO_2CF_3^+$, $CHO^+$, $C_2H_5OH^+$, $CH_3OH^+$, or $CH_3(CH_2)_w CHO^+$ (w is an integer of from 0 to 50).

For example, the material having low surface energy may be a fluorinated polymer including the repeating unit represented by Chemical Formula 1, but is not limited thereto.

For example, the material having low surface energy may be a fluorinated polymer including the repeating unit represented by Chemical Formula 1, wherein a is a number of from 100 to 10000, b is a number of from 50 to 1000, and $Q_1$ is —[O—$C(R_1)(R_2)$—$C(R_3)(R_4)]_c$—$[OCF_2CF_2]_d$—$R_5$.

For example, the material having low surface energy may be a fluorinated polymer including the repeating unit represented by Chemical Formula 1, wherein a is a number of from 100 to 10000, b is a number of from 50 to 1000, and $Q_1$ is —[O—$C(R_1)(R_2)$—$C(R_3)(R_4)]_c$—$[OCF_2CF_2]_d$—$R_5$, wherein c is a number of from 1 to 3, $R_1$, $R_2$, and $R_3$ is —F, $R_4$ is —$CF_3$, d is a number of from 1 to 3, and $R_5$ is —$SO_3M$, but is not limited thereto.

Otherwise, the material having low surface energy may be a fluorinated silane-based material represented by the following Chemical Formula 10:

$$X-M^f_n-M^h_m-M^a_r-(G)_p \qquad \text{<Chemical Formula 10>}$$

wherein X is a terminal group;

$M^f$ is a unit derived from a fluorinated monomer prepared by a condensation reaction of perfluoropolyether alcohol, polyisocyanate, and an isocyanate reactive non-fluorinated monomer, or a fluorinated $C_1$-$C_{20}$ alkylene group;

$M^h$ is a unit derived from a non-fluorinated monomer;

$M^a$ is a unit having a silyl group represented by —$Si(Y_4)(Y_5)(Y_6)$, wherein $Y_4$, $Y_5$, and $Y_6$ are independently a halogen atom, a substituted or unsubstituted $C_1$-$C_{20}$ alkyl group, a substituted or unsubstituted $C_6$-$C_{30}$ aryl group, or a hydrolyzable substituent, and at least one of the $Y_4$, $Y_5$, and $Y_6$ is the hydrolyzable substituent;

G is a monovalent organic group including the residue of a chain transfer agent;

n is a number of from 1 to 100;

m is a number of from 0 to 100;

r is a number of from 0 to 100;

n+m+r is 2 or more; and p is a number of from 0 to 10.

For example, the X may be a halogen atom, the $M^f$ may be a fluorinated $C_1$-$C_{10}$ alkylene group, $M^h$ may be a $C_2$-$C_{10}$ alkylene group, the $Y_4$, $Y_5$, and $Y_6$ may be independently a halogen atom (Br, Cl, F, etc.), and p may be 0. For example, the fluorinated silane-based material represented by Chemical Formula 10 may be $CF_3CH_2CH_2SiCl_3$, but is not limited thereto.

A detailed description of the fluorinated silane-based material represented by Chemical Formula 10 is provided in U.S. Pat. No. 7,728,098, which is incorporated herein as a reference.

The conductive polymer may be a conductive polymer having a high conductivity of 0.1 S/cm or more, for example, 1 S/cm or more.

For example, the conductive polymer may include polythiophene, polyaniline, polypyrrole, polystyrene, sulfonated polystyrene, poly(3,4-ethylenedioxythiophene), a self-doping conductive polymer, a derivative thereof, or a combination of two or more thereof. The derivative may further include various kinds of sulfonic acids.

For example, the conductive polymer may include polyaniline/dodecylbenzene sulfonic acid (Pani:DBSA, see the following Chemical Formula), poly(3,4-ethylenedioxythiophene)/poly(4-styrenesulfonate) (PEDOT:PSS, see the following Chemical Formula), polyaniline/camphor sulfonic acid (Pani:CSA), or polyaniline/poly(4-styrenesulfonate) (PANI:PSS), etc., but is not limited thereto.

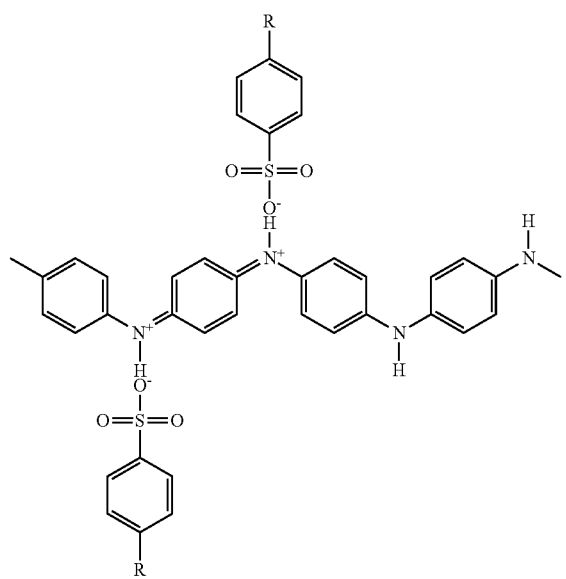

Pani:DBSA

-continued

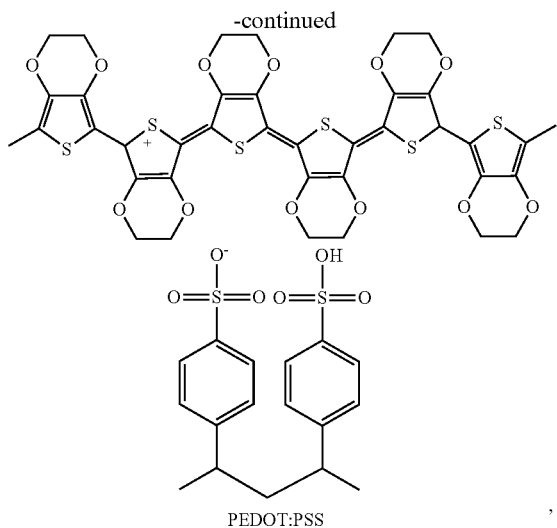

PEDOT:PSS

R may be H or a $C_1$-$C_{10}$ alkyl group.

The self-doping conductive polymer may have a degree of polymerization of from 10 to 10,000,000, and a repeating unit represented by the following Chemical Formula 13:

<Chemical Formula 13>

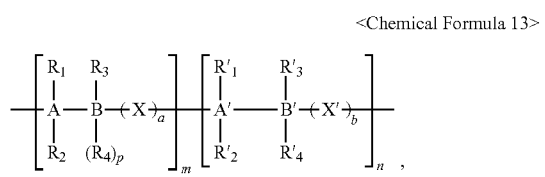

wherein 0<m<10,000,000, 0<n<10,000,000, 0≤a≤20, and 0≤b≤20;

at least one of $R_1$, $R_2$, $R_3$, $R'_1$, $R'_2$, $R'_3$, and $R'_4$ includes an ionic group, and A, B, A', and B' are independently selected from C, Si, Ge, Sn, and Pb;

$R_1$, $R_2$, $R_3$, $R'_1$, $R'_2$, $R'_3$, and $R'_4$ are independently selected from the group consisting of H, a halogen, a nitro group, a substituted or unsubstituted amino group, a cyano group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{30}$ cycloalkyl group, a substituted or unsubstituted $C_5$-$C_{30}$ heterocycloalkyl group, a substituted or unsubstituted $C_1$-$C_{30}$ alkylester group, and a substituted or unsubstituted $C_6$-$C_{30}$ arylester group, and H or a halogen element is selectively combined with carbon (C) in Chemical Formula 13;

$R_4$ is composed of a conjugated conductive polymer chain; and

X and X' are independently selected from the group consisting of a simple bond, O, S, a substituted or unsubstituted $C_1$-$C_{30}$ alkylene group, a substituted or unsubstituted $C_1$-$C_{30}$ heteroalkylene group, a substituted or unsubstituted $C_6$-$C_{30}$ arylene group, a substituted or unsubstituted $C_6$-$C_{30}$ arylalkylene group, a substituted or unsubstituted $C_2$-$C_{30}$ heteroarylene group, a substituted or unsubstituted $C_2$-$C_{30}$ heteroarylalkylene group, a substituted or unsubstituted $C_5$-$C_{20}$ cycloalkylene group, and a substituted or unsubstituted $C_5$-$C_{30}$ heterocycloalkylene group arylester group, and H or a halogen element is selectively combined with C in Chemical Formula 13.

For example, the ionic group may include a negative ionic group selected from the group consisting of $PO_3^{2-}$, $SO_3^-$, $COO^-$, $I^-$, and $CH_3COO^-$, and a positive ionic group selected from the group consisting of a metal ion selected from $Na^+$, $K^+$, $Li^+$, $Mg^{+2}$, $Zn^{+2}$, and $Al^{+3}$, and an organic ion selected from $H^+$, $NH_4^+$, and $CH_3(-CH_2-)_nO^+$ (n is a natural number of from 1 to 50), wherein the positive ionic group is paired with the negative ionic group.

For example, in the self-doping conductive polymer of Chemical Formula 13, at least one of $R_1$, $R_2$, $R_3$, $R'_1$, $R'_2$, $R'_3$, and $R'_4$ may be F or a group substituted by F, but is not limited thereto.

In the specification, as a specific example of the unsubstituted alkyl group, there is straight-chained or branched methyl, ethyl, propyl, isobutyl, sec-butyl, tert-butyl, pentyl, iso-amyl, hexyl, etc., and at least one H atom in the alkyl group may be substituted by a halogen atom, a hydroxy group, a nitro group, a cyano group, a substituted or unsubstituted amino group ($-NH_2$, $-NH(R)$, $-N(R')(R'')$, R' and R" are independently an alkyl group having a carbon number of 1 to 10), an amidino group, a hydrazine or hydrazone group, a carboxyl group, a sulfonic acid group, a phosphate group, a $C_1$-$C_{20}$ alkyl group, a $C_1$-$C_{20}$ halogenated alkyl group, a $C_1$-$C_{20}$ alkenyl group, a $C_1$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, or a $C_6$-$C_{20}$ heteroarylalkyl group.

In the specification, the heteroalkyl group means that at least one carbon atom of a main chain of the alkyl group, preferably 1 to 5 carbon atoms, is substituted by a hetero atom, such as an oxygen atom, a sulfur atom, a nitrogen atom, a phosphorus atom, etc.

In the specification, the aryl group refers to an aromatic carbocycle system including at least one aromatic ring, and the rings may be attached together by a pendant method or fused. As a specific example of the aryl group, there is an aromatic group, such as phenyl, naphthyl, and tetrahydronaphthyl, and at least one H atom of the aryl group may be substituted by the same substituent as the alkyl group.

In the specification, the heteroaryl group refers to an aromatic ring system having 5 to 30 ring atoms including 1, 2 or 3 hetero atoms selected from N, O, P, and S, wherein the remaining ring atoms are carbon. The rings may be attached together by a pendant method or fused. In addition, at least one H atom of the heteroaryl group can be substituted by the same substituent as the alkyl group.

In the specification, the alkoxy group refers to a radical $-O$-alkyl, wherein the alkyl is as defined as above. As a specific example, the alkoxy group may be methoxy, ethoxy, propoxy, isobutyloxy, sec-butyloxy, pentyloxy, iso-amyloxy, hexyloxy, etc., and at least one H atom of the alkoxy group can be substituted by the same substituent as the alkyl group.

The heteroalkoxy group which is a substituent used in an embodiment of the present invention inherently refers to the alkoxy, except that at least one hetero atom, for example, O, S, or N, may exist in the alkyl chain. For example, the heteroalkoxy group is $CH_3CH_2OCH_2CH_2O-$, $C_4H_9OCH_2CH_2OCH_2CH_2O-$, $CH_3-O-(CH_2CH_2O)_nH$, etc.

In the specification, the arylalkyl group indicates that some of H atoms of the defined aryl group are substituted by a low-grade alkyl, for example, a radical, such as methyl, ethyl, and propyl. For example, the arylalkyl group is benzyl, phenylethyl, etc. At least one H atom of the arylalkyl group can be substituted by the same substituent as the alkyl group.

In the specification, the heteroarylalkyl group indicates that some of H atoms of the heteroaryl group are substituted by a low-grade alkyl, and the definition on the heteroaryl of the heteroarylalkyl group is as described above. At least one H atom of the heteroarylalkyl group can be substituted by the same substituent as the alkyl group.

In the specification, the aryloxy group refers to radical —O-aryl, wherein the aryl is as defined above. As a specific example, the aryloxy group may be phenoxy, naphthoxy, anthracenyloxy, phenanthrenyloxy, fluorenyloxy, indenyloxy, etc. At least one H atom of the aryloxy group can be substituted by the same substituent as the alkyl group.

In the specification, the heteroaryloxy group refers to radical —O-heteroaryl, and the heteroaryl is as defined above.

In the specification, as a specific example of the heteroaryloxy group, there are a benzyloxy group, a phenylethyloxy group, etc. At least one H atom of the heteroaryloxy group can be substituted by the same substituent as the alkyl group.

In the specification, the cycloalkyl group refers to a monovalent monocyclic system having 5 to 30 carbon atoms. At least one H atom of the cycloalkyl group can be substituted by the same substituent as the alkyl group.

In the specification, the heterocycloalkyl group refers to a monovalent monocyclic system having 5 to 30 ring atoms including 1, 2 or 3 hetero atoms selected from N, O, P, and S, wherein the remaining ring atoms are carbon. At least one H atom of the heterocycloalkyl group can be substituted by the same substituent as the alkyl group.

In the specification, the alkylester group refers to a functional group in which an alkyl group and an ester group are combined, wherein the alkyl group is as defined above.

In the specification, the heteroalkylester group refers to a functional group in which a heteroalkyl group and an ester group are combined, wherein the heteroalkyl group is as defined above.

In the specification, the arylester group refers to a functional group in which an aryl group and an ester group are combined, wherein the aryl group is as defined above.

In the specification, the heteroarylester group refers to a functional group in which a heteroaryl group and an ester group are combined, wherein the heteroaryl group is as defined above.

The amino group in the embodiment of the present invention refers to —$NH_2$, —NH(R), or —N(R')(R"), and R' and R" are independently an alkyl group having a carbon number of from 1 to 10.

In the specification, the halogen is fluorine (F), chlorine (Cl), bromine (Br), iodine (I), or astatine (At), and preferably F.

The total concentration of the material having low surface energy in the conductive polymer layer 130 may be 10 parts by weight to 500 parts by weight, for example, 20 parts by weight to 400 parts by weight per 100 parts by weight of the conductive polymer, but is not limited thereto. When the content of the material having low surface energy satisfies the above described range, the conductive polymer layer 130 has a concentration gradient of the material having low surface energy as described above, and an organic light emitting device having high light emitting efficiency can be implemented.

The thickness of conductive polymer layer 130 may be 2 to 300 nm, for example, 5 to 100 nm. When the thickness of the conductive polymer layer 130 satisfies the above described range, required characteristics, such as energy level gradients, high surface ionization potential $Y_3$, and high light emitting efficiency, can be achieved.

The low molecular light emitting layer 150 may include a low molecular light emitting material. Electron mobility of the low molecular light emitting material may be the same as or greater than hole mobility of the low molecular light emitting material.

Since the organic light emitting device 100, as shown in FIG. 2, has a relationship of $X_1 < Y_1 < Y_3$, a large amount of holes may be quickly transferred from the anode 120 to the low molecular light emitting layer 150. Meanwhile, since the organic light emitting device 100, as shown in FIG. 2, has a relationship of $Y_4 < Z_2$, electron injection from the cathode 170 to the low molecular light emitting layer 150 may be impeded. Accordingly, even when a low molecular light emitting material of which electron mobility is the same as or greater than the hole mobility is used for the low molecular light emitting layer 150, since the electron transfer to the conductive polymer layer 130 is impeded, electrons are accumulated at an interface between the conductive polymer layer 130 and the low molecular light emitting layer 150, and thereby the exciton forming region 160 in which electrons and holes are recombined to form excitons are effectively formed between the conductive polymer layer 130 and the low molecular light emitting layer 150. Accordingly, the organic light emitting device 100 can have high light emitting efficiency.

The thickness of low molecular light emitting layer 150 may be 10 to 100 nm, for example, 10 to 60 nm. When the thickness of the low molecular light emitting layer 150 satisfies the range, excellent light emitting characteristics can be obtained with no increase in driving voltage.

The low molecular light emitting layer 150 may include a host and dopant. The host may include at least one of an ambipolar transport material and an electron transport material.

The ambipolar transport material may be selected from a well-known material having a hole transport ability and an electron transport ability at the same time. For example, the ambipolar transport material may be a tert(9,9-diarylfluorene) derivative (e.g. 2,7-bis[9,9-di(4-methylphenyl)-fluoren-2-yl]-9,9-di(4-methylphenyl)fluorine) (TDAF), 2,7-bis (9,9-spirobifluoren-2-yl)-9,9-spirobifluorene (BDAF), 9,10-di(naphth-2-yl)anthracene (ADN), 2-tert-butyl-9,10-bis-[(β-naphthyl)-anthracene (TBADN), 2,6-di(t-butyl)-9,10-di(2-naphthyl)anthracene (2TBADN), 2,6-di(t-butyl)-9,10-di46-(t-butyl)(2-naphthyl)]anthracene (3TBADN), 2-methyl-9,10-bis(naphthalen-2-yl)anthracene (MADN), terfluorene (E3), etc., but is not limited thereto.

The electron transport material may be a material having a greater electron mobility than hole mobility under the same electric field. For example, the electron transport material may be selected from a material for an electron transport layer and/or an electron injection layer of an organic light emitting device. The electron transport material may be tris(8-hydro xyquino line) aluminum ($Alq_3$), 2,2',2"-(benzene-1,3,5-triyl)-tris(1-phenyl-1H-benzimidazole (TPBI), 2,9-dimethyl-4,7-diphenyl-1,10-phenanthroline (BCP), 4,7-diphenyl-1,10-phenanthro line (Bphen), bis(2-methyl-8-quinolinolate)-4-(phenylphenolato)aluminum (Balq), 1,3-bis [2-(2,2'-bipyridine-6-yl)-1,3,4-oxadiazo-5-yl]benzene (Bpy-OXD), 6,6'-bis[5-(biphenyl-4-yl)-1,3,4-oxadiazo-2-yl]-2,2'-bipyridyl (BP-OXD-Bpy), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2,9-bis(naphthalen-2-yl)-4,7-diphenyl-1,10-phenanthro line (NBphen), tris(2,4,6-trimethyl-3-(pyridin-3-yl)phenyl)borane (3TPYMB), phenyl-dipyrenylphosphine oxide (POPy2), 3,3',5,5'-tetra[(m-pyridyl)-phen-3-yl]biphenyl (BP4mPy), 1,3,5-tri[(3-pyridyl)-phen-3-yl]benzene (TmPyPB), 1,3-bis[3,5-di(pyridin-3-yl)phenyl]benzene (BmPyPhB), bis(10-hydroxybenzo[h]quinolinato)beryllium (Bepq2), bis(10-hydroxybenzo[h]quinolinato)-beryllium (Bebq₂), diphenylbis(4-(pyridin-3-yl)phenyl)silane (DPPS), or (1,3,5-tri(p-pyrid-3-yl-phenyl)benzene (TpPyPB), but is not limited thereto.

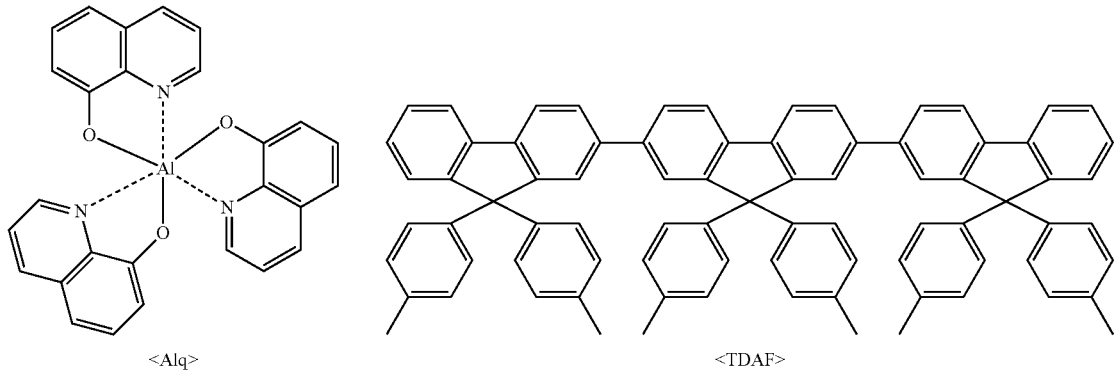

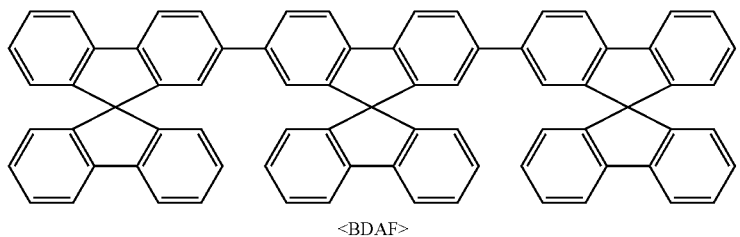

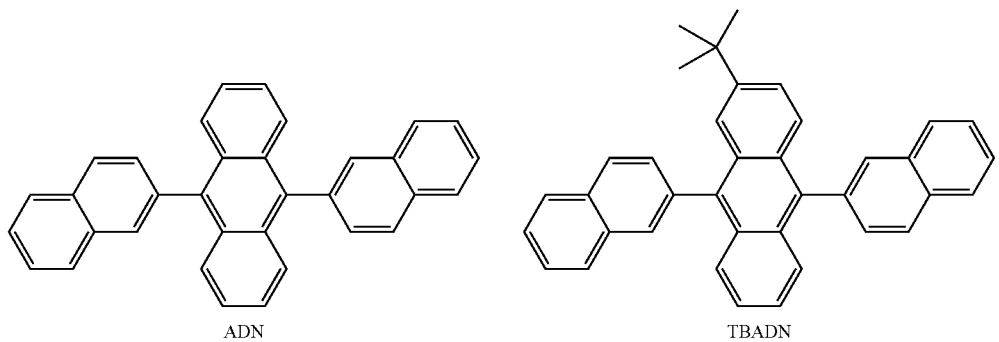

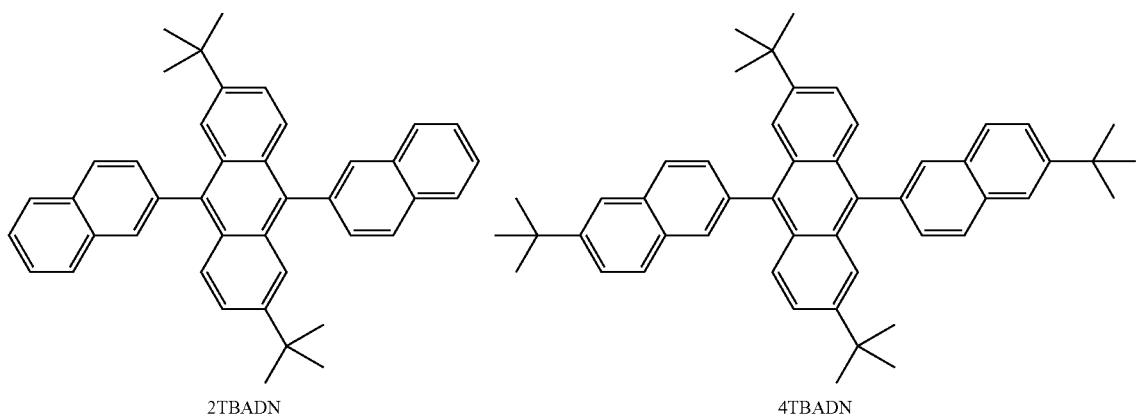

-continued
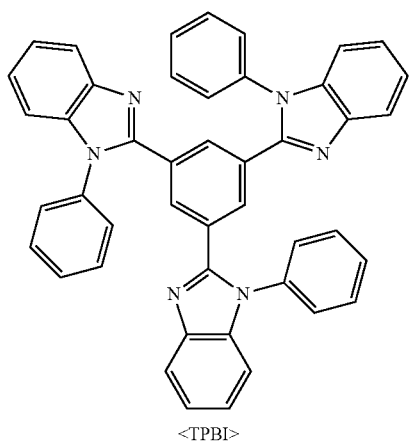
<TPBI>
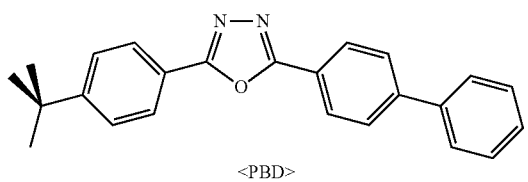
<PBD>
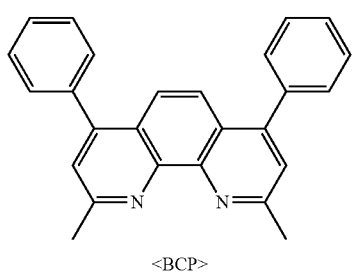
<BCP>
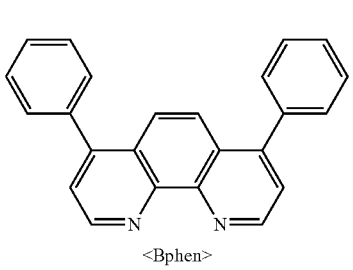
<Bphen>
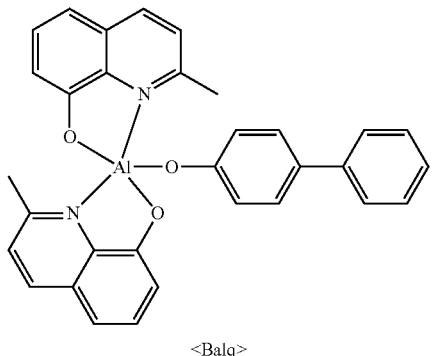
<Balq>
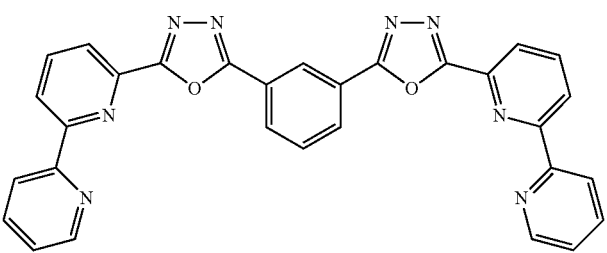
<Bpy-OXD>
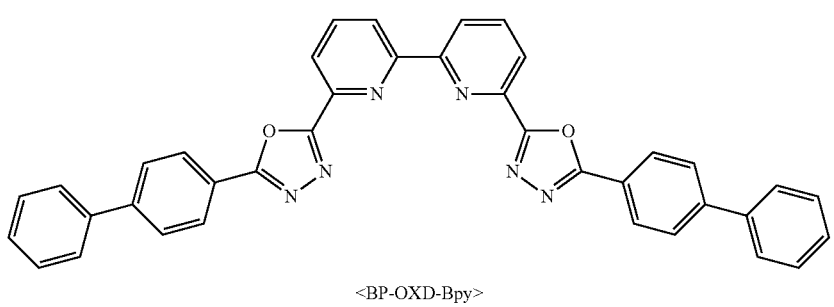
<BP-OXD-Bpy>
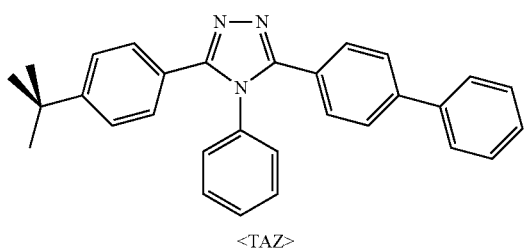
<TAZ>
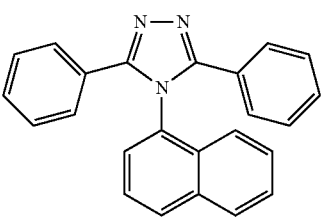
<NTAZ>

-continued
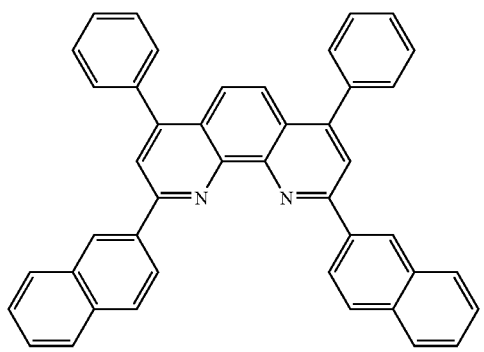
<NBphen>
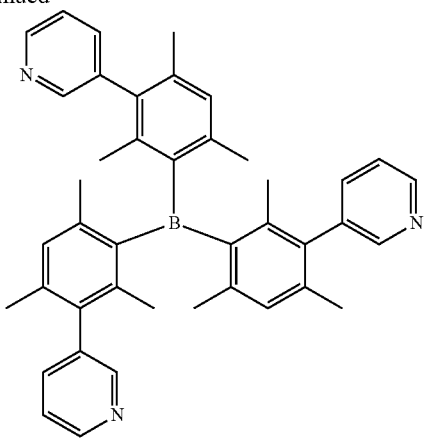
<3TPYMB>
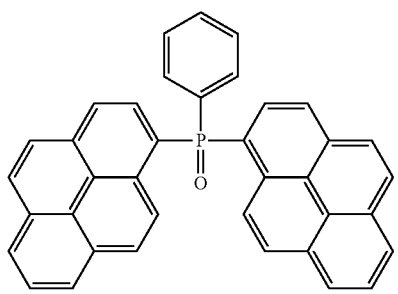
<POPy2>
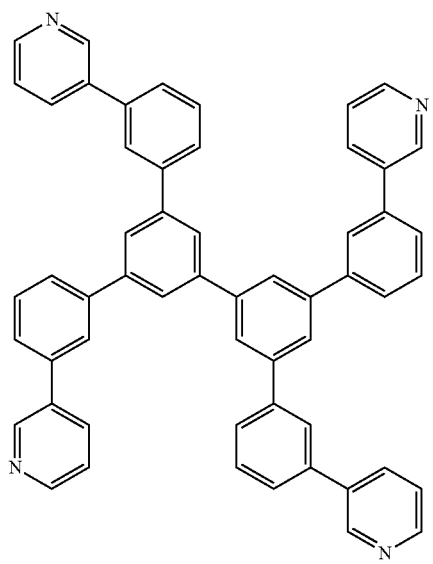
<BP4mpy>
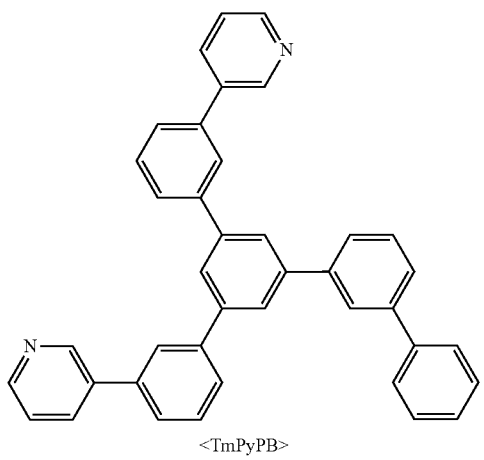
<TmPyPB>
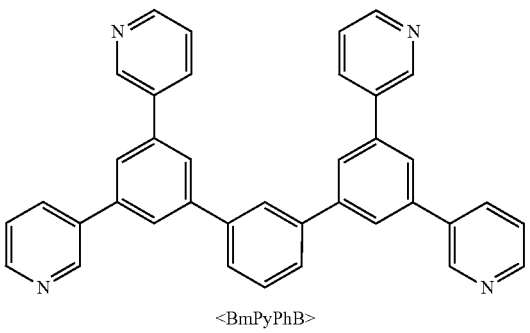
<BmPyPhB>

-continued

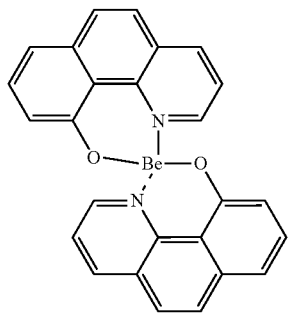
<Bepq2>

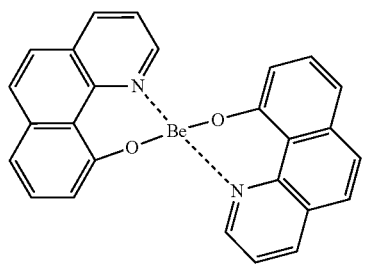
<Bebq2>

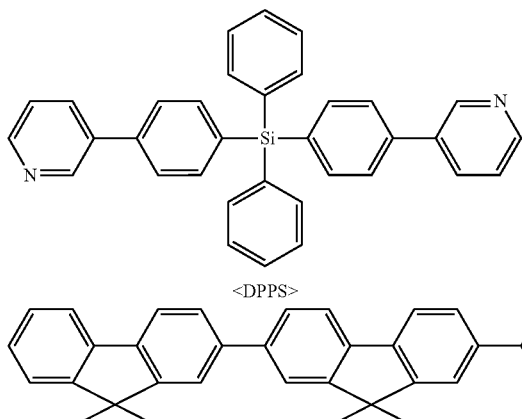
<DPPS>

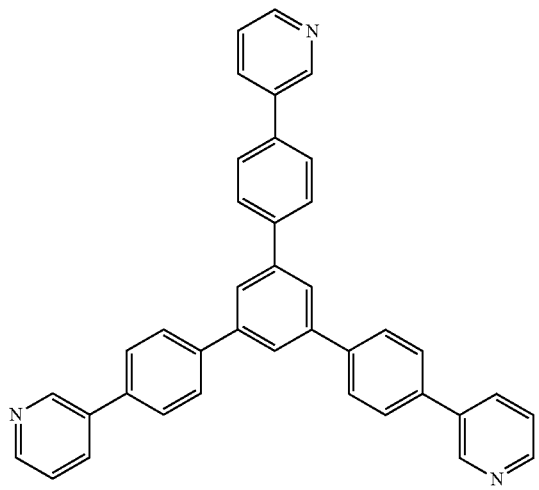
<TpPyPB>

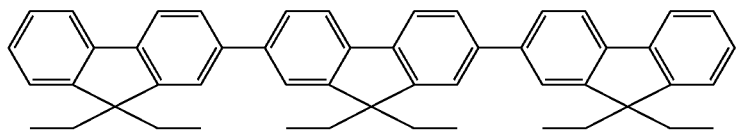
E3

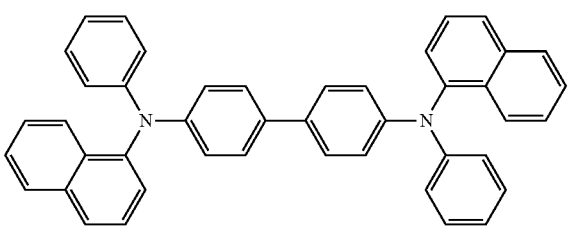
<NPB>

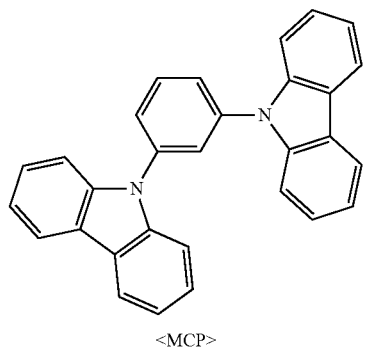
<MCP>

The host of the low molecular light emitting layer 150 may further include a hole transport material in addition to one or more of the above described ambipolar transport material and electron transport material.

The hole transport material may be a material having greater hole mobility than electron mobility under the same electric field. For example, the hole transport material may be a material for a hole injection layer or a hole transport layer of an organic light emitting device. For example, the hole transport material may be 1,3-bis(carbazol-9-yl)benzene (MCP), 1,3,5-tris(carbazol-9-yl)benzene (TCP), 4,4',4''-tris(carbazol-9-yl)triphenylamine (TcTa), 4,4'-bis(carbazol-9-yl)biphenyl (CBP), N,N'-bis(naphthalen-1-yl)-N,N'-bis(phenyl)-benzidine (NPB), N,N'-bis(naphthalen-2-yl)-N,N'-bis(phenyl)-benzidine ((3-NPB), N,N'-bis(naphthalen-1-yl)-N,N'-bis(phenyl)-2,2'-dimethylbenzidine (α-NPD), di-[4-(N,N-ditolyl-amino)-phenyl]cyclohexane (TAPC), N,N,N',N'-tetra-naphthalen-2-yl-benzidine (β-TNB), N4,N4,N4',N4'-tetra(biphenyl-4-yl)biphenyl-4,4'-diamine (TPD15), etc., but is not limited thereto.

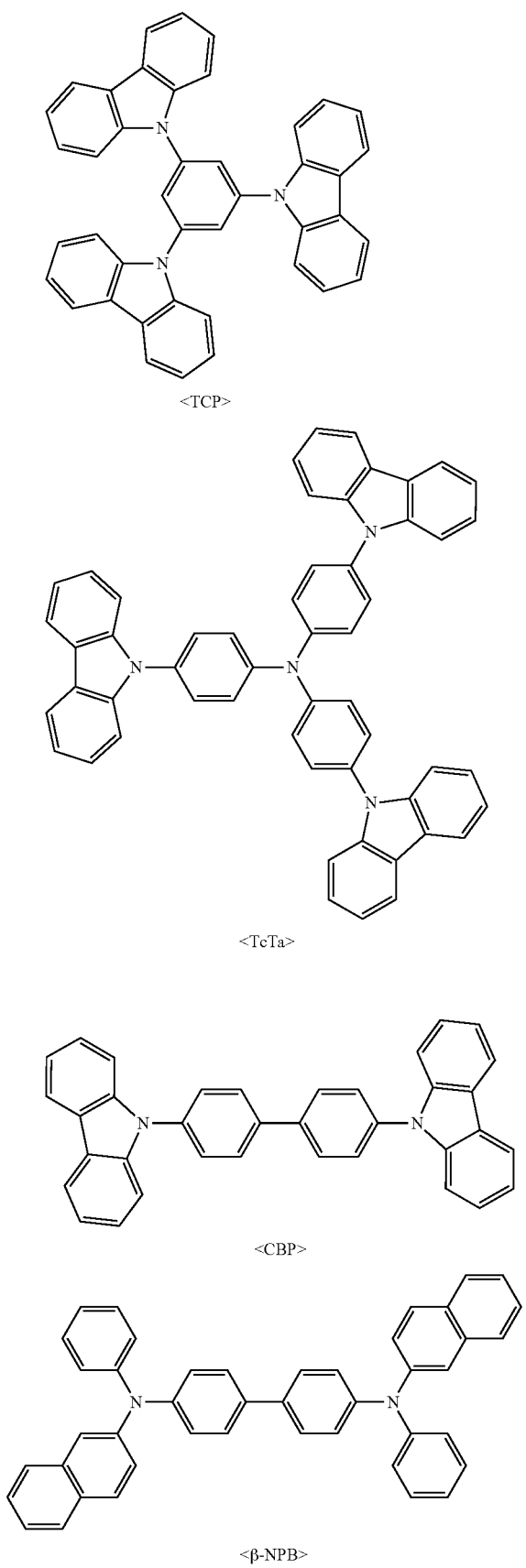

As the dopant of the low molecular light emitting layer 150, at least one of red, green, and blue dopants may be used.

As the red dopant of the low molecular light emitting layer 150, rubrene(5,6,11,12-tetraphenylnaphthacene), Pt(II) octaethylporphine (PtOEP), tris(1-phenylisoquinoline)iridium (III) (Ir(piq)$_3$), bis(1-phenylisoquino line)(acetylacetonate) iridium(III) (Ir(piq)2(acac)), Btp$_2$Ir(acac), 5,6,11,12-tetraphenylnaphthacene (Rubrene), etc. may be used, but is not limited thereto.

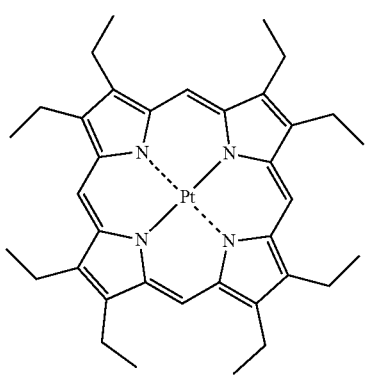

PtOEP

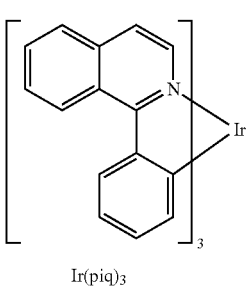

Ir(piq)₃

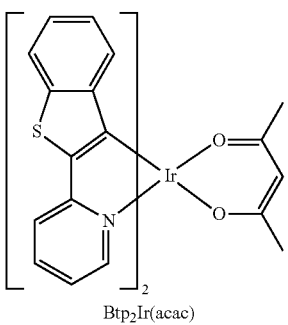

Btp₂Ir(acac)

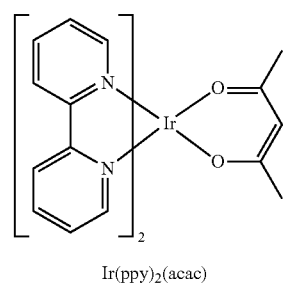

Ir(ppy)₂(acac)

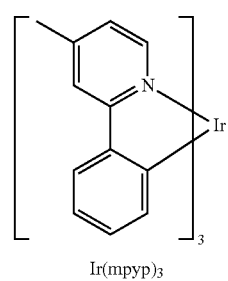

Ir(mpyp)₃

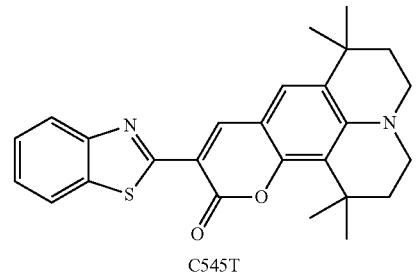

C545T

As the green dopant of the low molecular light emitting layer 150, tris(2-phenylpyridine)iridium(III) (Ir(ppy)₃), bis(2-phenylpyridine)(acetylacetonate)iridium(III) (Ir(ppy)2(acac)), Ir(mpyp)₃, C545T (10-(2-benzothiazolyl)-1,1,7,7-tetramethyl-2,3,6,7-tetrahydro-1H,5H,11H-[1]benzopyrano[6,7,8-ij]quinolizine-11-on, see the following Chemical Formula), etc. may be used, but is not limited thereto.

Meanwhile, as the blue dopant of the low molecular light emitting layer 150, bis(3,5-difluoro-2-(2-pyridyl)phenyl-(2-carboxypyridyl)iridium(III) (FIrPic), F₂Irpic, (F₂ppy)₂Ir(tmd), Ir(dfppz)₃, terfluorene, 4,4'-bis[4-(di-p-tolylamino)styryl]biphenyl (DPAVBi), 2,5,8,11-tetra-tert-butyl perylene (TBP), etc. may be used, but is not limited thereto.

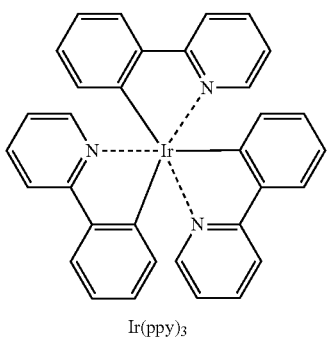

Ir(ppy)₃

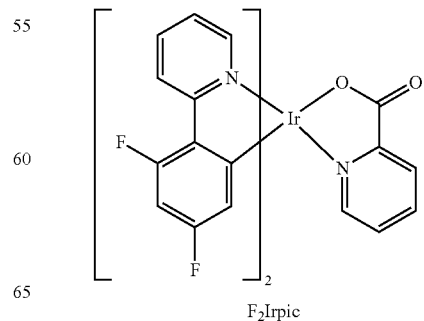

F₂Irpic

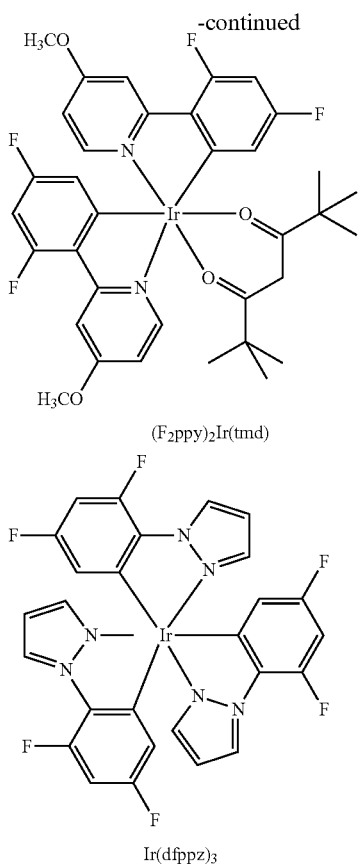

(F₂ppy)₂Ir(tmd)

Ir(dfppz)₃

The low molecular light emitting layer 150 may implement a red light, a green light, and a blue light by containing respective one of the red, green, and blue dopants, or a white light by containing two or more of the red, green, and blue dopants, and various modifications are possible.

The dopant may be doped into only a part of the low molecular light emitting layer 150. For example, when the total thickness of the low molecular light emitting layer 150 is 70 nm, the host and the dopant may exist in an interface of the low molecular light emitting layer 150 in contact with the conductive polymer layer 130, that is, a region having a thickness of 20 nm within 20 nm from the surface 1B 145 of the low molecular light emitting layer 150, and only the host with no dopant may exist in the remaining region having a thickness of 50 nm. Otherwise, when the total thickness of the low molecular light emitting layer 150 is 70 nm, only the host with no dopant may exist in an interface of the low molecular light emitting layer 150 in contact with the conductive polymer layer 130, that is, a region having a thickness of 10 nm within 10 nm from the surface 1B 145 of the low molecular light emitting layer 150, the host and the dopant may exist in a region having a thickness of 20 nm and spaced 10 to 30 nm apart from the surface 1B 145, and only the host with no dopant may exist in the remaining region having a thickness of 40 nm. Further, various modifications are possible.

The low molecular light emitting layer 150 according to the embodiment of the present invention may be fabricated by a vacuum deposition process and a solution process. The vacuum deposition process normally uses a thermal deposition method, and the solution process uses a spin-coating method, an ink-jet printing method, a nozzle printing method, a spray coating method, a screen printing method, a doctor blade coating method, a gravure printing method, or an offset printing method.

The cathode 170 may use a metal, an alloy, a conductive compound, and a combination thereof. As a specific example, Li, Mg, Al, Al—Li, Ca, Mg—In, Mg—Ag, graphene, carbon nanotube, and a conductive polymer, etc. may be used. In addition, in order to obtain a top-emitting device, ITO, IZO, etc. may be used.

The cathode 170 may have a single layer or multilayer structure. For example, the cathode 170 may include an electron injection layer and metal-containing layer. For example, the electron injection layer may use LiF, NaCl, CsF, Li₂O, BaO, BaF₂, Liq (lithium quinolate), etc. which are well-known electron injection material, as a material accelerating electron injection. The metal-containing layer may be a single metal layer, or may include two or more metals or a metal oxide. As the metal-containing layer, Li, Mg, Al, Al—Li, Ca, Mg—In, Mg—Ag, etc. may be used, but is not limited thereto.

When the cathode 170 includes the electron injection layer and the metal-containing layer, the surface 2B 147 of the low molecular light emitting layer 150 may be in contact with a surface of the cathode 170. The thickness of the electron injection layer may be about 0.1 to 10 nm, for example, 0.5 to 5 nm. When the thickness of the electron injection layer satisfies the above-described range, sufficient electron injection characteristics can be obtained substantially with no rising in a driving voltage.

A method of fabricating the organic light emitting device 100 according to an embodiment of the present invention is as follows.

First, an anode 120 is formed on a substrate. A material for forming the anode 120 may be referred to the aforementioned description. The anode 120 may be formed using a variety of methods, such as a deposition method, a sputtering method, etc.

Next, a conductive polymer layer 130 as described above is formed on the anode 120. The conductive polymer layer 130 may be formed by supplying a composition for forming the conductive polymer layer including a conductive polymer, a material having low surface energy, and a solvent on the anode 120, and performing a heat treatment.

A description of the conductive polymer and the material having low surface energy among the composition for forming the conductive polymer layer is referred to the aforementioned description.

The solvent among the composition for forming the conductive polymer layer may be a solvent which has miscibility with the conductive polymer and the material having low surface energy and is easily removed by heat. The solvent may be a polar solvent, for example, water, alcohol (methanol, ethanol, n-propanol, 2-propanol, n-butanol, etc.), a polar organic solvent (e.g. ethylene glycol, glycerol, dimethylformamide (DMF), dimethyl sulfoxide (DMSO), etc.), or a combination of two or more thereof.

The solvent may be a mixture of two or more different materials. Otherwise, the solvent may include the polar organic solvent. For example, the solvent may be a polar organic solvent, a mixture of water and alcohol, a mixture of water and a polar organic solvent, a mixture of alcohol and a polar organic solvent, or a mixture of water, alcohol, and polar organic solvent, and various modifications are possible.

As an example of the polar organic solvent, as described above, ethylene glycol, glycerol, DMF, DMSO, and a combination of two or more thereof may be possible, but is not limited thereto.

Since the polar organic solvent increases aggregation and crystallization of the conductive polymer included in the composition for forming the conductive polymer layer, conductivity of the composition for forming the conductive polymer layer and the conductive polymer layer 130 fabricated from the composition may be controlled or improved.

When the solvent includes the polar organic solvent, a content of the polar organic solvent may be 1 to 30 weight % per 100 weight % of the composition for forming the conductive polymer layer, but is not limited thereto.

Since the conductive polymer layer 130 is formed not, for example, by independently forming the conductive polymer-containing layer and the material layer having low surface energy, but, as described above, by a single deposition process in which the composition for forming the conductive polymer layer including the conductive polymer, material having low surface energy, and solvent is supplied onto the anode 120 and then a heat treatment thereof is performed (it is because each material is self-arranged to generate a concentration gradient due to a surface energy difference between the conductive polymer and the material having low surface energy), the fabrication process is simple. Accordingly, since the conductive polymer layer 130 is formed using the solution process capable of reducing manufacturing costs, manufacturing cost reduction and large size fabrication of the organic light emitting device 100 may be achieved.

The low molecular light emitting layer 150 may be formed by one selected among various well-known methods, such as vacuum deposition, casting, Langmuir-Blodgett (LB) deposition, spin-coating, ink-jet printing, nozzle printing, spray coating, screen printing, doctor blade coating, gravure printing, or offset printing. For example, the low molecular light emitting layer 150 may be formed using the vacuum deposition method. When the vacuum deposition method is selected, a condition of deposition may be different depending on a target compound, a structure and thermal properties of a target layer, etc. For example, the condition of deposition may be selected from the range of deposition temperature of 100 to 500° C., the range of vacuum degree of $10^{-10}$ to $10^{-3}$ torr, and the range of deposition rate of from 0.01 to 100 Å/sec. Otherwise, when the spin-coating method is selected, the condition of coating may be different depending on a target compound, a structure and thermal properties of a target layer, etc., and the condition of coating may be selected from the range of coating speed of 2000 to 5000 rpm and the range of heat treatment temperature of 80° C. to 200° C. (a temperature of heat treatment for removing solvent after coating).

A detailed description of the low molecular light emitting material included in the low molecular light emitting layer 150 is referred to the aforementioned description.

Next, a cathode 170 is formed on the low molecular light emitting layer 150. A material for forming the cathode 170 is referred to the aforementioned description.

The organic light emitting device 100 may have advantages as follows.

1) Since the organic light emitting device 100 has the above-described conductive polymer layer 130, satisfies the relationship of $X_1<Y_1<Y_3$ (see FIG. 2), and has an ionization potential gradually increasing from $Y_1$ to $Y_3$, hole injection from the anode 120 to the low molecular light emitting layer 150 can be effectively done without forming a hole transport layer.

2) Since the organic light emitting device 100 has the above-described conductive polymer layer 130 and satisfies the relationship of $Y_4<Z_2$ (see FIG. 2), electrons injected from the cathode 170 to the low molecular light emitting layer 150 may not be transported to the conductive polymer layer 130. Accordingly, electrons may be accumulated at an interface, and an exciton forming region in which holes and electrons recombine may be formed between the conductive polymer layer 130 and the low molecular light emitting layer 150. As a result, since the surface 2A 145 having a relatively high concentration of the material having low surface energy in the conductive polymer layer 130 functions as a buffer layer which prevents exciton quenching, high light emitting efficiency can be obtained even if an electron blocking layer is not formed between the conductive polymer layer 130 and the low molecular light emitting layer 150.

3) Since the organic light emitting device 100 has the above-described conductive polymer layer 130 and satisfies the relationship of $X_1<Y_1<Y_3$ (see FIG. 2), hole injection to the light emitting layer can be effectively done, and since the organic light emitting device 100 has the above-described conductive polymer layer 130 and satisfies the relationship of $Y_4<Z_2$ (see FIG. 2), electrons are well-accumulated at the interface before being transported to the conductive polymer layer 130. Accordingly, a low molecular light emitting material of which electron mobility is the same as or greater than hole mobility may be used in the low molecular light emitting layer 150. As a result, high light emitting efficiency can be obtained even if an electron transport layer is not formed between the low molecular light emitting layer 150 and the cathode 170.

4) Since the conductive polymer layer 130 of the organic light emitting device 100 is a single layer formed in just one solution process, and the organic light emitting device 100 has high light emitting efficiency without any separate hole transport layer and electron transport layer, the structure of organic light emitting device 100 can be simplified. Accordingly, manufacturing costs of the organic light emitting device 100 can be saved, and mass fabrication of large-size organic light emitting devices can be achieved.

The organic light emitting device has been described with reference to FIGS. 1 and 2, but is not limited thereto.

While the example embodiments of the present invention and their advantages have been described with reference to the accompanying drawings, it will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

EXAMPLES

Evaluation Example 1

Evaluation of Conductive Polymer Layer

<Formation of Conductive Polymer Layer>

A composition for forming a conductive polymer layer (100 weight %) was prepared, which included a conductive poly(3,4-ethylenedioxythiophene):poly(styrenesulfonate) (PEDOT:PSS) solution (Clevios™ AI4083 manufactured by Heraeus, 6 parts by weight of PSS per 1 part by weight of PEDOT, a conductivity of $1\times10^{-3}$ S/cm) and a solution of the following polymer 100 (5 weight % of polymer 100 dispersed in a mixture of water and alcohol (water:alcohol=4.5:5.5 (v/v)), manufactured by Aldrich Co.). Here, the mixing ratio of the PEDOT:PSS solution and the polymer 100 solution was adjusted such that the content of the polymer 100 (based on a solid state) per 1 part by weight of PEDOT was 1.6 parts by weight.

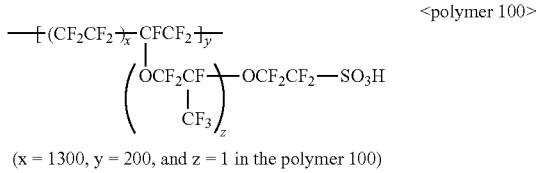

<polymer 100>

(x = 1300, y = 200, and z = 1 in the polymer 100)

A conductive polymer layer 1 having a thickness of 50 nm was formed by spin-coating the composition for forming the conductive polymer layer on a glass substrate and performing a heat treatment at 200° C. for 10 minutes.

Next, conductive polymer layers 2, 3, 4, and 5 (wherein a surface of the conductive polymer layer in contact with the glass substrate is a surface 1A, and a surface opposite to the surface 1A is a surface 2A) were formed on glass substrates using the same method as used in manufacturing the conductive polymer layer 1, except that the conductive polymer layers were formed after adjusting the mixing ratio of the PEDOT:PSS solution and the polymer 100 solution such that the content of the polymer 100 per 1 part by weight of PEDOT was 3.2 parts by weight, 6.3 parts by weight, 12.7 parts by weight, and 25.4 parts by weight, respectively.

Meanwhile, for comparison, a polymer layer A was formed using the same method as used in manufacturing the conductive polymer layer 1, except that the polymer 100 was not used.

<Evaluation of Molecular Distribution>

Figure 3:
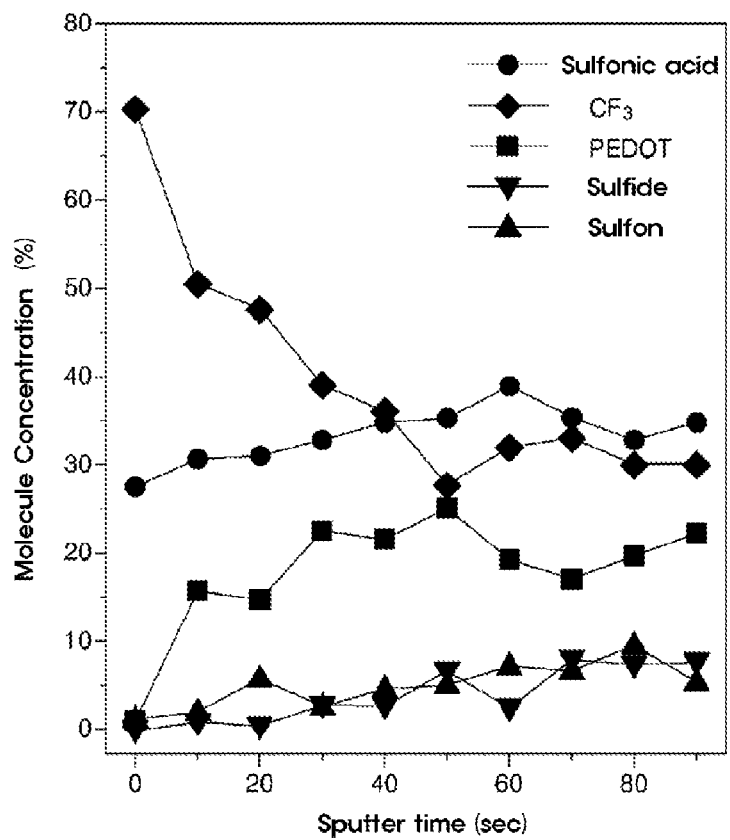
FIG. 3 is a diagram showing molecular distribution of a conductive polymer layer 5 over sputter time in Evaluation Example 1.

In order to study molecular distribution of a surface (that is the surface 2A) of the conductive polymer layer 5, an X-ray photoelectron spectroscopy (XPS, Model ESCALAB 220iXL manufactured by VG Scientific) was performed on the conductive polymer layer 5. The result is shown in FIG. 3. FIG. 3 is an XPS spectrum of the conductive polymer layer 5 over sputter time (that is, relative to the depth of the conductive polymer layer 5). By analyzing a PEDOT (164.5 eV) peak, PSS and PSSH (168.4 and 168.9 eV) peaks (S2p), and a peak of the polymer 100 ($CF_3$ and F1s) in the XPS spectrum of the conductive polymer layer 5, concentration of each moiety was evaluated.

Referring to FIG. 3, along the direction from the surface 2A (sputter time=0 sec) of the conductive polymer layer 5 toward the surface 1A of the conductive polymer layer 5, the concentration of $CF_3$ moiety which represents the concentration of polymer 100 substantially decreases, and the concentration of PEDOT substantially increases. Accordingly, it is found that the concentrations of the PEDOT:PSS and the polymer 100 in the conductive polymer layer 5 have a gradient which varies according to the depth of the conductive polymer layer 5.

<Evaluation of Work Function>

Ionization potentials of the conductive polymer layers 1 to 5 and the polymer layer A were evaluated using an ultraviolet photoelectron spectroscopy in air (Model AC2 manufactured by Riken Keiki). The results are shown in Table 1.

TABLE 1

| | PEDOT/PSS/polymer 100 (weight ratio) | Ionization potential (eV) |
|---|---|---|
| Polymer layer A | 1/6/0 | 5.20 |
| conductive polymer layer 1 | 1/6/1.6 | 5.55 |
| conductive polymer layer 2 | 1/6/3.2 | 5.63 |
| conductive polymer layer 3 | 1/6/6.3 | 5.72 |

TABLE 1-continued

| | PEDOT/PSS/polymer 100 (weight ratio) | Ionization potential (eV) |
|---|---|---|
| conductive polymer layer 4 | 1/6/12.7 | 5.79 |
| conductive polymer layer 5 | 1/6/25.4 | 5.95 |

The ionization potential values of the conductive polymer layers 1 to 5 correspond to $Y_3$ in FIG. 2.

<Evaluation of Photoluminescence (PL) Intensity of Low Molecular Light Emitting Layer Formed on Conductive Polymer Layer>

A sample 1 (50 nm) having a structure of glass substrate/conductive polymer layer 1 (50 nm)/light emitting layer (5 nm) was fabricated by co-depositing $Bebq_2$ and C545T (a weight ratio of 98:2) on the conductive polymer layer 1 (that is, on the surface 2A of the conductive polymer layer 1) to form the light emitting layer having a thickness of 50 nm.

Sample 2 (50 nm), Sample 3 (50 nm), Sample 4 (50 nm), Sample 5 (50 nm), and Sample A (50 nm) were respectively formed using the same method as used in manufacturing Sample 1 (50 nm) except that the conductive polymer layers 2 to 5 and the polymer layer A were used instead of the conductive polymer layer 1.

PL spectrums of Sample 2 (50 nm) to Sample 5 (50 nm), and Sample A (50 nm) were evaluated using ISC PC1 spectrofluorometer in which a Xenon lamp is installed. The results are shown in FIG. 4A.

Figure 4A:
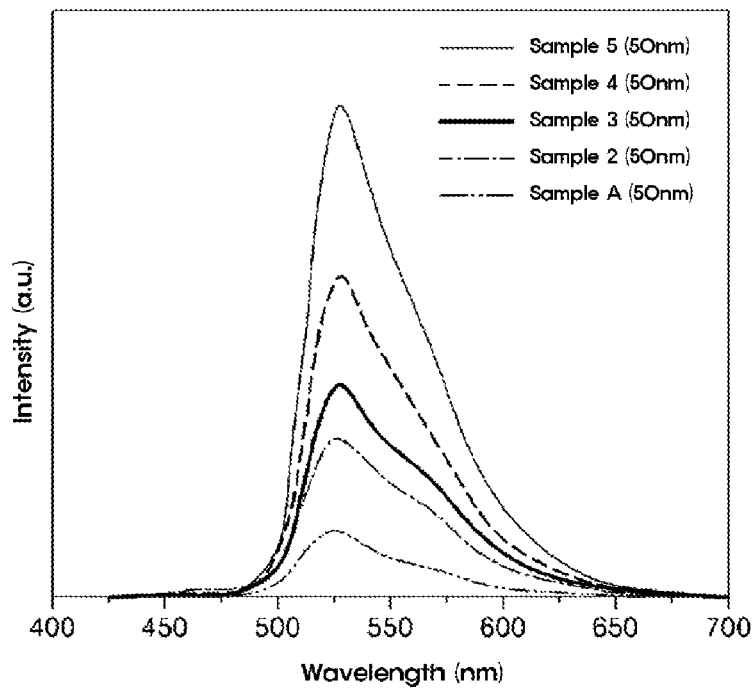
FIGS. 4A and 4B show photoluminescence (PL) spectrums of samples including conductive polymer layers 2 to 5, and a polymer layer A in Evaluation Example 1.

Referring to FIG. 4A, it is found that PL intensities of Sample 2 (50 nm) to Sample 5 (50 nm) which respectively adopt the conductive polymer layers 2 to 5 are greater than a PL intensity of Sample A (50 nm), and Sample 2 (50 nm) to Sample 5 (50 nm) have superior blocking ability of exciton quenching to Sample A (50 nm).

Sample 1 (10 nm) to Sample 5 (10 nm), and Sample A (10 nm) were fabricated using the same method as used in manufacturing the Sample 1 (50 nm) to Sample 5 (50 nm), and Sample A (50 nm) except that the thickness of light emitting layer was changed to 10 nm, and PL spectrums of Sample 2 (10 nm) to Sample 5 (10 nm), and Sample A (10 nm) were evaluated according to the aforementioned description. The results are shown in FIG. 4B.

Figure 4B:
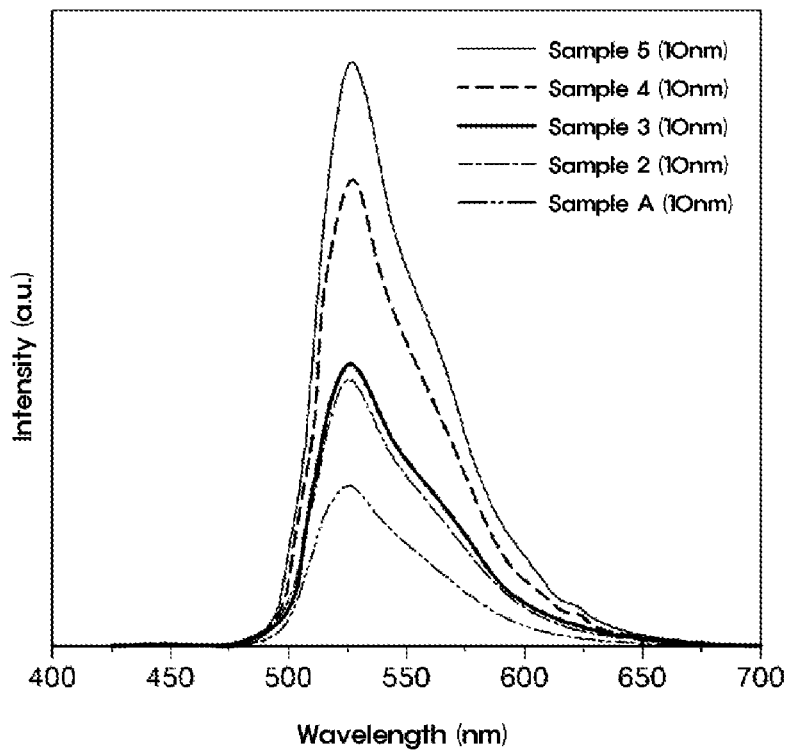

Referring to FIG. 4B, it is found that PL intensities of Sample 2 (10 nm) to Sample 5 (10 nm) which respectively adopt the conductive polymer layers 2 to 5 are greater than a PL intensity of Sample A (10 nm), and Sample 2 (10 nm) to Sample 5 (10 nm) have superior blocking ability of exciton quenching to Sample A (10 nm).

<Evaluation of PL life Characteristics>

PL lifetimes of Sample 1 (50 nm) to Sample 5 (50 nm), and Sample A (50 nm) were evaluated using a time-correlated single photon counting (TCSPC) experiment. The results are shown in FIG. 5.

Figure 5:
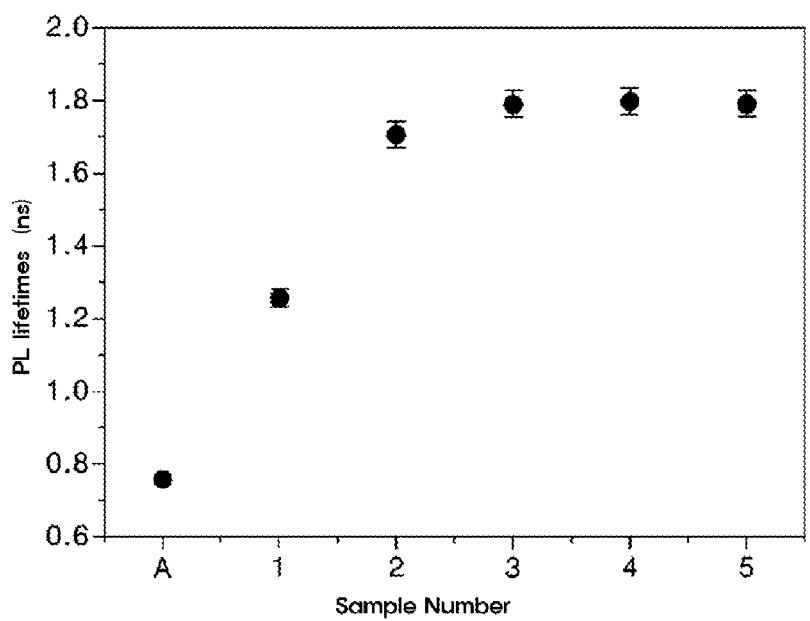
FIG. 5 is a diagram showing PL lifetimes of samples including conductive polymer layers 2 to 5, and a polymer layer A in Evaluation Example 1.

Referring to FIG. 5, it is found that Sample 1 (50 nm) to Sample 5 (50 nm) which respectively adopt the low molecular light emitting layers respectively on the conductive polymer layers 1 to 5 have superior PL life characteristics to Sample A (50 nm). In addition, it is found that the PL life increases as the content of the polymer 100 in the conductive polymer layer increases, and an exciton quenching phenomenon of the low molecular light emitting layer can be reduced by adopting the conductive polymer layer.

Example 1

A 15 Ω/$cm^2$ ITO glass substrate (1200 Å) manufactured by Corning, Inc. was prepared and cut to a size of 2 mm×2 mm, and a surface of the ITO glass was subjected to a UV-ozone treatment for 15 minutes. A conductive polymer layer 1 was formed on the ITO anode using the same method as described in Evaluation Example 1, and then a 70 nm light emitting layer was formed on the conductive polymer layer 1 by co-depositing Bebq$_2$ and C545T (a weight ratio of 98:2). Next, an organic light emitting device (ITO anode/conductive polymer layer 1 (50 nm)/light emitting layer (70 nm)/Liq (1 nm)/Al cathode) was fabricated in such a way that a Li/Al cathode was formed by forming a 1 nm Liq layer and a 130 nm Al layer by sequentially depositing Liq and Al.

Example 2

An organic light emitting device (ITO anode/conductive polymer layer 2 (50 nm)/light emitting layer (70 nm)/Liq (1 nm)/Al cathode) was fabricated using the same method as described in Example 1 except that the conductive polymer layer 2 was formed instead of the conductive polymer layer 1.

Example 3

An organic light emitting device (ITO anode/conductive polymer layer 3 (50 nm)/light emitting layer (70 nm)/Liq (1 nm)/Al cathode) was fabricated using the same method as described in Example 1 except that the conductive polymer layer 3 was formed instead of the conductive polymer layer 1.

Example 4

An organic light emitting device (ITO anode/conductive polymer layer 4 (50 nm)/light emitting layer (70 nm)/Liq (1 nm)/Al cathode) was fabricated using the same method as described in Example 1 except that the conductive polymer layer 4 was formed instead of the conductive polymer layer 1.

Example 5

An organic light emitting device (ITO anode/conductive polymer layer 5 (50 nm)/light emitting layer (70 nm)/Liq (1 nm)/Al cathode) was fabricated using the same method as described in Example 1 except that the conductive polymer layer 5 was formed instead of the conductive polymer layer 1.

Comparative Example 1

An organic light emitting device (ITO anode/NPB layer (20 nm)/light emitting layer (70 nm)/Liq (1 nm)/Al cathode) was fabricated using the same method as described in Example 1 except that an NPB layer having a thickness of 20 nm was formed instead of the conductive polymer layer 1 by depositing NPB on the ITO anode.

Comparative Example 2

An organic light emitting device (ITO anode/light emitting layer (70 nm)/Liq (1 nm)/Al cathode) was fabricated using the same method as described in Example 1 except that the conductive polymer layer 1 was not formed.

Comparative Example 3

An organic light emitting device (ITO anode/2-TNATA layer (50 nm)/light emitting layer (70 nm)/Liq (1 nm)/Al cathode) was fabricated using the same method as described in Example 1 except that a 2-TNATA layer having a thickness of 50 nm was formed instead of the conductive polymer layer 1 by depositing 2-TNATA(4,4',4"-Tris(N-(2-naphthyl)-N-phenyl-amino)-triphenylamine) on the ITO anode.

Comparative Example 4

An organic light emitting device (ITO anode/conductive polymer layer A (50 nm)/light emitting layer (70 nm)/Liq (1 nm)/Al cathode) was fabricated using the same method as described in Example 1 except that the polymer layer A was formed instead of the conductive polymer layer 1 using the same method as described in Evaluation Example 1.

Evaluation Example 2

Evaluation of Device

Figure 6A:
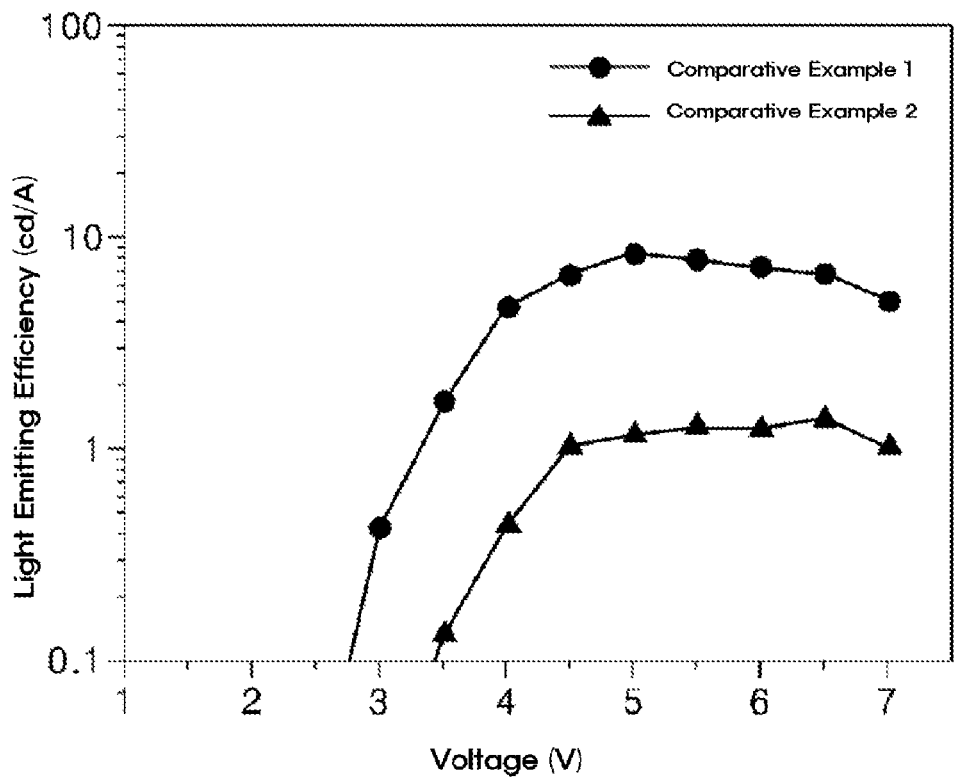
FIGS. 6A to 6D are diagrams showing light emitting efficiency of organic light emitting devices of Comparative Examples 1 to 4, and Example 5.
Figure 6B:
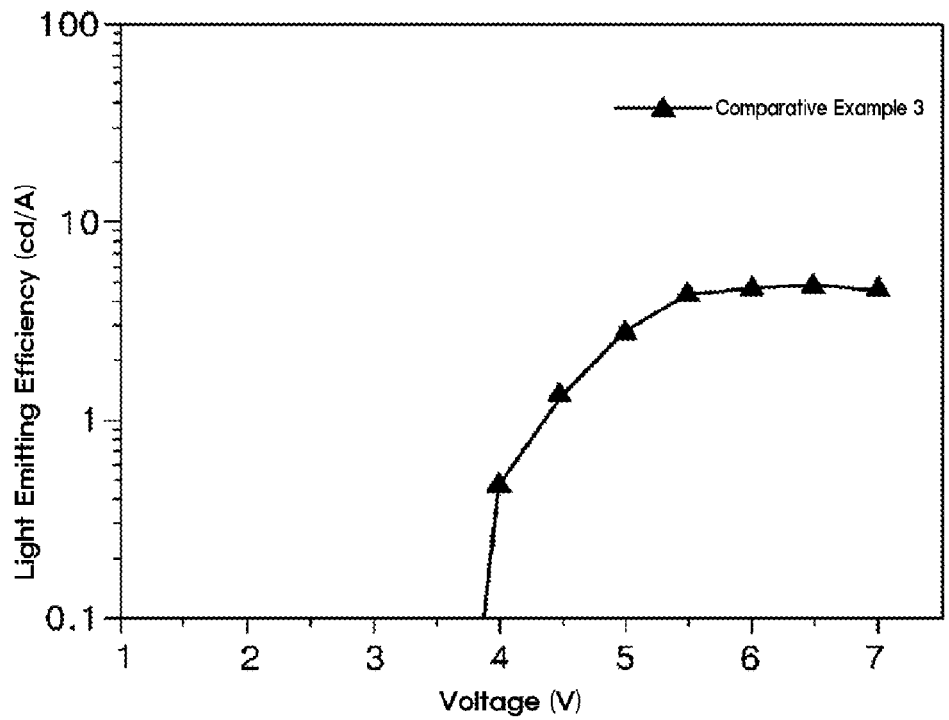
Figure 6C:
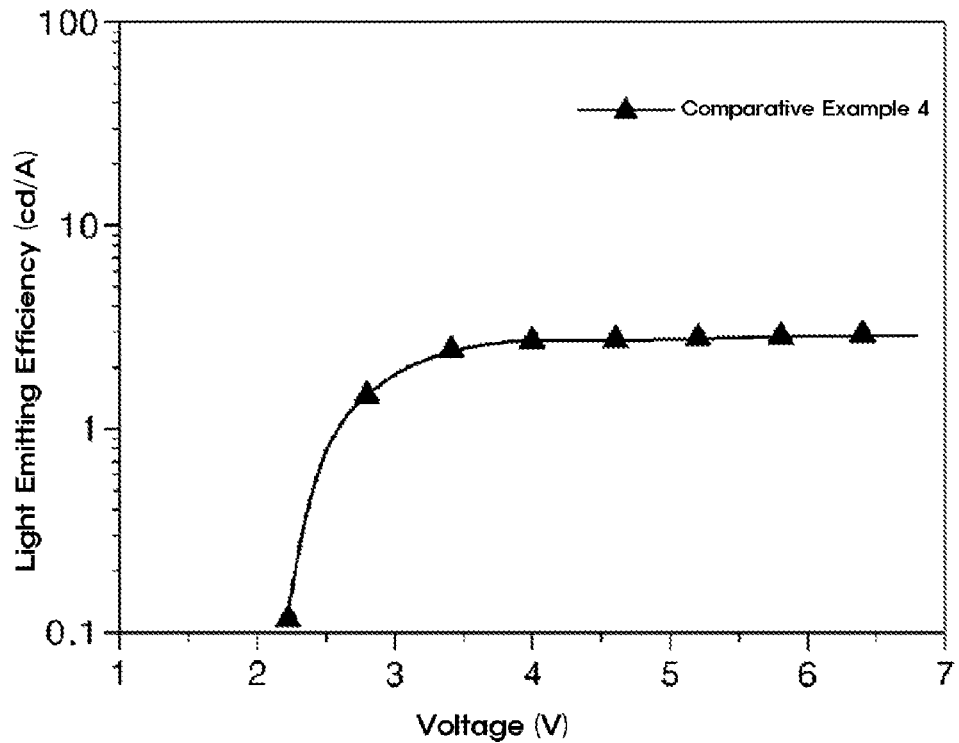
Figure 6D:
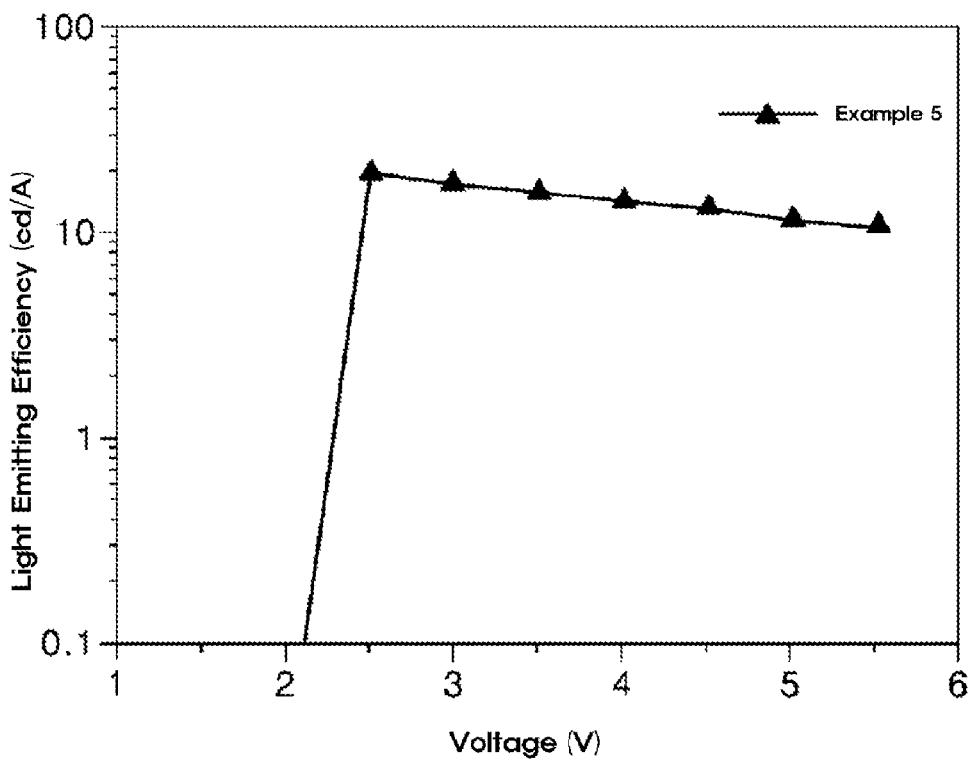

Light emitting efficiencies of the organic light emitting devices in Example 5 and Comparative Examples 1 to 4 were evaluated using Keithley 236 source measuring apparatus and Minolta CS 2000 spectroradiometer. The results are shown in FIG. 6A (Comparative Examples 1 and 2), FIG. 6B (Comparative Example 3), FIG. 6C (Comparative Example 4), and FIG. 6D (Example 5).

Referring to FIGS. 6A to 6D, it is found that the organic light emitting device of Example 5 has superior light emitting efficiency than Comparative Examples 1 to 4).

DESCRIPTION OF REFERENCE NUMERALS OF THE DRAWINGS

120: anode
130: conductive polymer layer
150: low molecular light emitting layer
170: cathode

The invention claimed is:

1. An organic light emitting device, comprising:
an anode, a conductive polymer layer having a surface 1A and a surface 2A opposite to the surface 1A, a low molecular light emitting layer having a surface 1B and a surface 2B opposite to the surface 1B, and a cathode which are sequentially stacked,
wherein a surface of the anode is in contact with the surface 1A of the conductive polymer layer, the surface 2A of the conductive polymer layer is in contact with the surface 1B of the low molecular light emitting layer, and the surface 2B of the low molecular light emitting layer is in contact with a surface of the cathode,
the conductive polymer layer is a single layer including a conductive polymer having a conductivity of $1 \times 10^{-7}$ S/cm to less than 0.1 S/cm, and a material having low surface energy, a concentration of the material having low surface energy of the surface 2A is greater than a concentration of the material having low surface energy of the surface 1A, the absolute value of a low unoccupied molecular orbital (LUMO) energy level of the surface 2A is smaller than the absolute value of a LUMO energy level of the low molecular light emitting layer, and the surface 2A functions to prevent exciton quenching, and
the low molecular light emitting layer includes a low molecular light emitting material, and electron mobility of the low molecular light emitting material is the same as or greater than hole mobility of the low molecular light emitting material.

2. The organic light emitting device of claim 1, wherein the absolute value of a high occupied molecular orbital (HOMO) energy level of the surface 1A is greater than a work function of the anode.

3. The organic light emitting device of claim 1, wherein the absolute value of a HOMO energy level of the surface 2A is greater than the absolute value of a HOMO energy level of the low molecular light emitting layer.

4. The organic light emitting device of claim 1, wherein, during operation, an exciton-forming region is formed at an interface between the conductive polymer layer and the low molecular light emitting layer.

5. The organic light emitting device of claim 1, wherein the concentration of the material having low surface energy gradually increases along a direction from the surface 1A toward the surface 2A.

6. The organic light emitting device of claim 1, wherein the material having low surface energy is a fluorinated material including at least one fluorine (F).

7. The organic light emitting device of claim 1, wherein the material having low surface energy is a fluorinated polymer having any one of repeating units of the following Chemical Formulas 1 to 3:

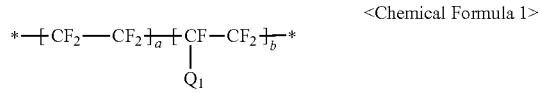
<Chemical Formula 1> wherein a is a number of from 0 to 10,000,000, b is a number of from 1 to 10,000,000, $Q_1$ is —[O—C($R_1$)($R_2$)—C($R_3$)($R_4$)]$_c$—[OCF$_2$CF$_2$]$_d$—$R_5$, —COOH, or —O—$R_f$—$R_6$, $R_1$, $R_2$, $R_3$, and $R_4$ are independently —F, —CF$_3$, —CHF$_2$, or —CH$_2$F, c and d are independently a number of from 0 to 20, $R_f$ is —(CF$_2$)$_z$— (z is an integer of from 1 to 50) or —(CF$_2$CF$_2$O)$_z$—CF$_2$CF$_2$— (z is an integer of from 1 to 50), $R_5$ and $R_6$ are independently —SO$_3$M, —PO$_3$M$_2$, or —CO$_2$M, and M is Na$^+$, K$^+$, Li$^+$, H$^+$, CH$_3$(CH$_2$)$_w$NH$_3^+$ (w is an integer of from 0 to 50), NH$_4^+$, NH$_2^+$, NHSO$_2$CF$_3^+$, CHO$^+$, C$_2$H$_5$OH$^+$, CH$_3$OH$^+$, or CH$_3$(CH$_2$)$_w$CHO$^+$ (w is an integer of from 0 to 50);

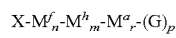
<Chemical Formula 2>
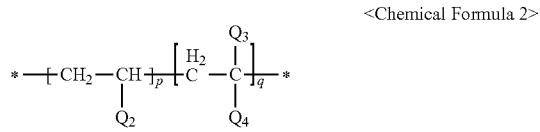

wherein $Q_2$ is hydrogen (H), a substituted or unsubstituted C$_5$-C$_{60}$ aryl group, or —COOH, $Q_3$ is H or a substituted or unsubstituted C$_1$-C$_{20}$ alkyl group, $Q_4$ is —O—(CF$_2$)$_r$—SO$_3$M, —O—(CF$_2$)$_r$—PO$_3$M$_2$, —O—(CF$_2$)$_r$—CO$_2$M, or —CO—NH—(CH$_2$)$_s$—(CF$_2$)$_t$—CF$_3$, r, s, and t are independently a number of from 0 to 20, and M is Na$^+$, K$^+$, Li$^+$, H$^+$, CH$_3$(CH$_2$)$_w$NH$_3^+$ (w is an integer of from 0 to 50), NH$_4^+$, NH$_2^+$, NHSO$_2$CF$_3^+$, CHO$^+$, C$_2$H$_5$OH$^+$, CH$_3$OH$^+$, or CH$_3$(CH$_2$)$_w$CHO$^+$ (w is an integer of from 0 to 50); and

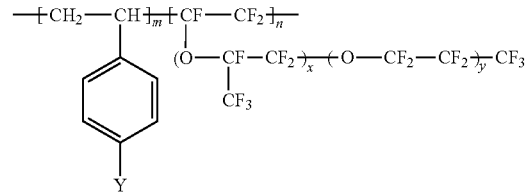
<Chemical Formula 3> wherein m and n are 0≤m≤10,000,000 and 0<n≤10,000,000, x and y are independently a number of from 0 to 20, Y is —SO$_3$M, —PO$_3$M$_2$, or —CO$_2$M, and M is Na$^+$, K$^+$, Li$^+$, H$^+$, CH$_3$(CH$_2$)$_w$NH$_3^+$ (w is an integer of from 0 to 50), NH$_4^+$, NH$_2^+$, NHSO$_2$CF$_3^+$, CHO$^+$, C$_2$H$_5$OH$^+$, CH$_3$OH$^+$, or CH$_3$(CH$_2$)$_w$CHO$^+$ (w is an integer of from 0 to 50).

8. The organic light emitting device of claim 1, wherein the material having low surface energy is a fluorinated oligomer represented by the following Chemical Formula 10:

X-M$^f_n$-M$^h_m$-M$^a_r$-(G)$_p$    <Chemical Formula 10> wherein X is a terminal group,

M$^f$ is a unit derived from a fluorinated C$_1$-C$_{20}$ alkylene group or a fluorinated monomer prepared by a condensation reaction of perfluoropolyether alcohol, polyisocyanate, and an isocyanate reactive non-fluorinated monomer, M$^h$ is a unit derived from a non-fluorinated monomer, M$^a$ is a unit having a silyl group represented by —Si(Y$_4$)(Y$_5$)(Y$_6$), Y$_4$, Y$_5$, and Y$_6$ are independently a halogen atom, a substituted or unsubstituted C$_1$-C$_{20}$ alkyl group, a substituted or unsubstituted C$_6$-C$_{30}$ aryl group, or a hydrolyzable substituent, and at least one of the Y$_4$, Y$_5$, and Y$_6$ is the hydrolyzable substituent, G is a monovalent organic group including the residue of a chain transfer agent, n is a number of from 1 to 100, m is a number of from 0 to 100, r is a number of from 0 to 100, n+m+r is 2 or more, and p is a number of from 0 to 10.

9. The organic light emitting device of claim 1, wherein the conductive polymer includes one or more of polythiophene, polyaniline, polypyrrole, poly(para-phenylene), polyfluorene, poly(3,4-ethylenedioxythiophene), a self-doping conductive polymer, and a derivative thereof.

10. The organic light emitting device of claim 1, wherein an ionization potential of the surface 2A is selected from the range of 5.0 eV to 6.5 eV.

11. The organic light emitting device of claim 1, wherein the low molecular light emitting layer includes a host and dopant, and the host includes at least one of an ambipolar transport material and an electron transport material.

12. The organic light emitting device of claim 11, wherein the host further includes a hole transport material.

13. The organic light emitting device of claim 11 or 12, wherein the dopant is doped in a part of the light emitting layer.

14. The organic light emitting device of claim 1, wherein the cathode includes an electron injection layer and a metal-containing layer, and the electron injection layer is in contact with the surface 2B of the low molecular light emitting layer.

15. A method of fabricating the organic light emitting device of claim 1, comprising:
   forming an anode on a substrate;
   forming a conductive polymer layer by supplying a composition for forming the conductive polymer layer including a conductive polymer, a material having low surface energy, and a solvent onto the anode, and performing a heat treatment;
   forming a low molecular light emitting layer on the conductive polymer layer; and
   forming a cathode on the low molecular light emitting layer.

16. The method of claim 15, wherein the solvent included in the composition for forming the conductive polymer layer is a polar solvent, and
   the polar solvent is one or more of water, alcohol, ethylene glycol, glycerol, dimethylformamide (DMF), dimethyl sulfoxide (DMSO), and acetone.

17. The method of claim 15, wherein the forming of the low molecular light emitting layer is performed using a vacuum deposition method.

18. The method of claim 15, wherein the forming of the low molecular light emitting layer is performed using casting, Langmuir-Blodgett (LB) deposition, spin-coating, ink jet printing, nozzle printing, spray coating, screen printing, doctor blade coating, gravure printing, or offset printing.

\* \* \* \* \*